(12) United States Patent
Kim et al.

(10) Patent No.: US 11,861,091 B2
(45) Date of Patent: Jan. 2, 2024

(54) DISPLAY DEVICE

(71) Applicant: LG Display Co., Ltd., Seoul (KR)

(72) Inventors: CheolSe Kim, Gyeonggi-do (KR);
SungChul Kim, Goyang-si (KR);
HoonBae Kim, Seoul (KR); SunYeop Kim, Seoul (KR); Jinseong Kim, Gimpo-si (KR); JuHan Kim, Bucheon-si (KR); Haewon Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/972,448

(22) Filed: Oct. 24, 2022

(65) Prior Publication Data

US 2023/0195249 A1    Jun. 22, 2023

(30) Foreign Application Priority Data

Dec. 20, 2021   (KR) .................. 10-2021-0182501
Dec. 30, 2021   (KR) .................. 10-2021-0193489
Dec. 30, 2021   (KR) .................. 10-2021-0193490

(51) Int. Cl.
*G06F 3/041*        (2006.01)
*G06F 3/044*        (2006.01)
(Continued)

(52) U.S. Cl.
CPC .......... *G06F 3/0412* (2013.01); *G06F 3/0416* (2013.01); *G06F 3/0446* (2019.05); *H01L 25/0753* (2013.01); *H01L 33/62* (2013.01)

(58) Field of Classification Search
CPC .... G06F 3/0412; G06F 3/0416; G06F 3/0446; H01L 25/0753; H01L 33/62
See application file for complete search history.

(56) References Cited

U.S. PATENT DOCUMENTS 11,315,986 B2   4/2022   Kim et al.
11,449,183 B1*   9/2022   Yudin .................. G06F 3/0446
(Continued)

FOREIGN PATENT DOCUMENTS

KR    10-2020-0082355 A    7/2020
KR       10-2217164 B1    2/2021
(Continued)

OTHER PUBLICATIONS

Intellectual Property Office of the United Kingdom, Office Action, GB Patent Application No. 2216060.0, dated May 10, 2023, four pages.

*Primary Examiner* — Ryan A Lubit
(74) *Attorney, Agent, or Firm* — Fenwick & West LLP

(57) ABSTRACT

A display device includes a substrate including a plurality of sub pixels; a first touch electrode on the substrate and overlapping at least one subpixel from the plurality of sub pixels; a second touch electrode on the substrate and spaced apart from the first touch electrode and overlapping the at least one sub pixel; an insulating layer covering the first touch electrode and the second touch electrode; a plurality of charging transistors on the insulating layer and electrically connected to one of the first touch electrode and the second touch electrode; a plurality of sensing transistors on the insulating layer and electrically connected to one of the first touch electrode and the second touch electrode; a planarization layer covering the plurality of charging transistors and the plurality of sensing transistors; and a light emitting diode on the planarization layer.

20 Claims, 15 Drawing Sheets

(51) Int. Cl.
 *H01L 33/62* (2010.01)
 *H01L 25/075* (2006.01)

(56) References Cited

U.S. PATENT DOCUMENTS

| | | | |
|---|---|---|---|
| 2008/0309627 A1* | 12/2008 | Hotelling | G06F 3/044 |
| | | | 345/173 |
| 2016/0291777 A1* | 10/2016 | Xi | G06F 3/0443 |
| 2017/0010703 A1* | 1/2017 | Chen | G02F 1/133345 |
| 2017/0192571 A1* | 7/2017 | Kim | G02F 1/133345 |
| 2017/0329442 A1* | 11/2017 | Wang | G02F 1/13338 |
| 2018/0239488 A1 | 8/2018 | Lin et al. | |
| 2020/0212116 A1 | 7/2020 | Kim et al. | |
| 2020/0293134 A1* | 9/2020 | Shim | G06F 3/0443 |
| 2021/0373711 A1* | 12/2021 | Smith | G06F 3/0412 |
| 2022/0147190 A1* | 5/2022 | Chen | G06F 3/0446 |
| 2022/0216271 A1 | 7/2022 | Kim et al. | |

FOREIGN PATENT DOCUMENTS

| | | |
|---|---|---|
| KR | 10-2021-0085202 A | 7/2021 |
| TW | 201741830 A | 12/2017 |

\* cited by examiner

DISPLAY DEVICE

CROSS-REFERENCE TO RELATED APPLICATIONS

This application claims the priority of Republic of Korea Patent Application No. 10-2021-0182501 filed on Dec. 20, 2021, Republic of Korea Patent Application No. 10-2021-0193489 filed on Dec. 30, 2021, Republic of Korea Patent Application No. 10-2021-0193490 filed on Dec. 30, 2021, in the Korean Intellectual Property Office, each of which is hereby incorporated by reference in its entirety.

BACKGROUND

Field

The present disclosure relates to a display device, and more particularly to a display device which is capable of implementing an in-cell touch structure.

Description of the Related Art

Currently, as the world enters a full-scale information era, a field of a display device which visually expresses electrical information signals has been rapidly developed and studies are continued to improve performances of various display devices such as a thin-thickness, a light weight, and low power consumption.

Among such display devices, there is a display device which provides a touch-based input method to allow a user to easily, intuitively and conveniently input information or commands by departing from usual input methods, such as buttons, keyboards, or mouse. The touch based display device may be driven by dividing the driving time into a display driving period and a touch driving period. That is, the touch based display device performs display driving during the display driving period and senses a touch by the touch driving during the touch driving period which is proceeded subsequent to the display driving period.

SUMMARY

An object to be achieved by the present disclosure is to provide a display device with an in-cell touch structure.

Another object to be achieved by the present disclosure is to provide a display device which improves a touch sensing accuracy.

Objects of the present disclosure are not limited to the above-mentioned objects, and other objects, which are not mentioned above, can be clearly understood by those skilled in the art from the following descriptions.

In one embodiment, a display device comprises: a substrate including a plurality of sub pixels; a first touch electrode on the substrate, the first touch electrode overlapping at least one sub pixel from the plurality of sub pixels; a second touch electrode on the substrate and spaced apart from the first touch electrode, the second touch electrode overlapping the at least one sub pixel from the plurality of sub pixels; an insulating layer covering the first touch electrode and the second touch electrode; a plurality of charging transistors on the insulating layer, the plurality of charging transistors electrically connected to one of the first touch electrode and the second touch electrode; a plurality of sensing transistors on the insulating layer, the plurality of sensing transistors electrically connected to one of the first touch electrode and the second touch electrode; a planarization layer covering the plurality of charging transistors and the plurality of sensing transistors; and a light emitting diode on the planarization layer.

In one embodiment, a display device comprises: a substrate; a plurality of pixels on the substrate, the plurality of pixels including a first pixel comprising a light emitting element; a touch block on the substrate, the touch block including a first electrode including a plurality of first sub electrodes and a second electrode including a plurality of second sub electrodes that are interleaved between the plurality of first sub electrodes such that at least one first sub electrode is disposed between two second sub electrodes, wherein the first electrode and the second electrode overlap the light emitting element and are closer to the substrate than the light emitting element.

Other detailed matters of the exemplary embodiments are included in the detailed description and the drawings.

According to the present disclosure, a display device with an in-cell structure may be implemented with a simple process and a low cost.

According to the present disclosure, during the touch sensing, only a quantity of electric charges formed on the touch electrode may be sensed regardless of the magnitude of the parasitic capacitance between the touch electrode and the other components.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
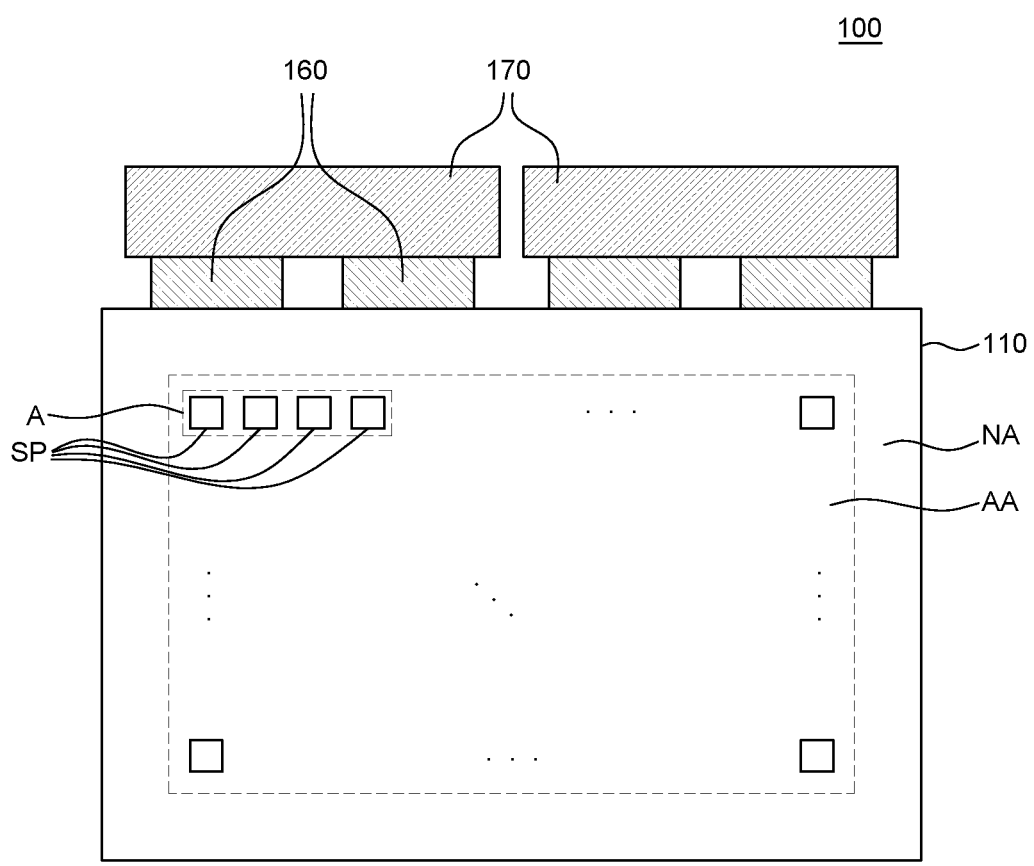
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

FIG. 1 is a plan view of a display device according to an exemplary embodiment of the present disclosure. For the convenience of description, in FIG. 1, among various components of the display device 100, a substrate 110, a plurality of flexible films 160, and a plurality of printed circuit boards 170 are illustrated.

Referring to FIG. 1, the display device 100 according to the exemplary embodiment of the present disclosure includes a substrate 110, a plurality of flexible films 160, and a plurality of printed circuit boards 170.

The substrate 110 is a substrate which supports and protects a plurality of components of the display device 100. The substrate 110 may be formed of a glass or a plastic material having flexibility. When the substrate 110 is formed of a plastic material, for example, the substrate may be formed of polyimide (PI), but it is not limited thereto.

The substrate 110 includes an active area AA and a non-active area NA.

The active area AA is disposed at a center portion of the substrate 110 and images are displayed in the active area of the display device 100. In the active area AA, a display element and various driving elements for driving the display element may be disposed. For example, the display element may be configured by a light emitting diode ED (e.g., a light emitting element) including an anode AN, an emission layer EL, and a cathode CT. Further, various driving elements for driving the display element, such as transistors TR1, TR2, TR3, a capacitor SC, or wiring lines may be disposed in the active area AA.

A plurality of sub pixels SP may be included in the active area AA. The sub pixel SP is a minimum unit which configures a screen and each of the plurality of sub pixels SP may include a light emitting diode ED and a driving circuit. The plurality of sub pixels SP may be defined as intersecting areas of a plurality of gate lines GL disposed in a first direction and a plurality of data lines DL disposed in a second direction which is different from the first direction. Here, the first direction may be a horizontal direction of FIG. 1 and the second direction may be a vertical direction of FIG. 1, but are not limited thereto. Each of the plurality of sub pixels SP may emit light having different wavelengths. For example, the plurality of sub pixels SP includes a red sub pixel SPR, a green sub pixel SPG, a blue sub pixel SPB, and a white sub pixel SPW.

The driving circuit of the sub pixel SP is a circuit for controlling the driving of the light emitting diode ED. For example, the driving circuit may include a switching transistor, a driving transistor, and a capacitor SC. The driving circuit may be electrically connected to signal lines such as a gate line GL and a data line DL which are connected to a gate driver and a data driver disposed in the non-active area NA.

The non-active area NA is disposed in a circumferential area of the substrate 110 and in the non-active area, images are not displayed. The non-active area NA is disposed so as to enclose the active area AA but is not limited thereto. Various components for driving a plurality of sub pixels SP disposed in the active area AA may be disposed in the non-active area NA. For example, a driver, a driving circuit, a signal line, and a flexible film 160 which supply a signal for driving the plurality of sub pixels SP may be disposed.

The plurality of flexible films 160 are disposed at one end of the substrate 110. The plurality of flexible films 160 are electrically connected to one end of the substrate 110. The plurality of flexible films 160 are films in which various components are disposed on a base film having malleability to supply a signal to the plurality of sub pixels SP of the active area AA. One end of the plurality of flexible films 160 is disposed in the non-active area NA of the substrate 110 to supply a data voltage to the plurality of sub pixels SP of the active area AA. In the meantime, even though the plurality of flexible films 160 is four in FIG. 1, the number of flexible films 160 may vary depending on the design but is not limited thereto.

In the plurality of flexible films 160, a driver such as a gate driver or a data driver may be disposed. The driver is a component which processes data for displaying images and a driving signal for processing the data. The driver may be disposed by a chip on glass (COG), a chip on film (COF), or a tape carrier package (TCP) technique depending on a mounting method. In the present specification, for the convenience of description, it is described that the driver is mounted on the plurality of flexible films 160 by a chip on film technique but is not limited thereto.

The printed circuit board 170 is connected to the plurality of flexible films 160. The printed circuit board 170 is a component which supplies signals to the driver. Various components may be disposed in the printed circuit board 170 to supply various driving signals such as a driving signal or a data voltage to the driver. In the meantime, even though two printed circuit boards 170 are illustrated in FIG. 1, the number of printed circuit boards 170 may vary depending on the design and is not limited thereto.

In the meantime, the display device 100 according to the exemplary embodiment of the present disclosure may be a display device with a touch structure. Accordingly, the display device 100 may further include a touch driver. The touch driver is disposed in the gate driver or disposed in the printed circuit board 170. When the touch driver is disposed in the gate driver, the gate driver may be mounted in the non-active area NA of the substrate 110 in a gate in panel (GIP) manner or attached to the non-active area NA.

In the meantime, the display device 100 may be configured by a top emission type or a bottom emission type, depending on an emission direction of light which is emitted from the light emitting diode.

According to the top emission type, light emitted from the light emitting diode is emitted above the substrate on which the light emitting diode is disposed. In the case of the top emission type, a reflective layer may be formed below the anode to allow the light emitted from the light emitting diode to travel above the substrate, that is, toward the cathode.

According to the bottom emission type, light emitted from the light emitting diode is emitted below the substrate on which the light emitting diode is disposed. In the case of the bottom emission type, the anode may be formed only of a transparent conductive material and the cathode may be formed of the metal material having a high reflectance to allow the light emitted from the light emitting diode to travel below the substrate.

Hereinafter, for the convenience of description, the description will be made by assuming that the display device 100 according to an exemplary embodiment of the present disclosure is a bottom emission type display device, but it is not limited thereto.

Figure 2:
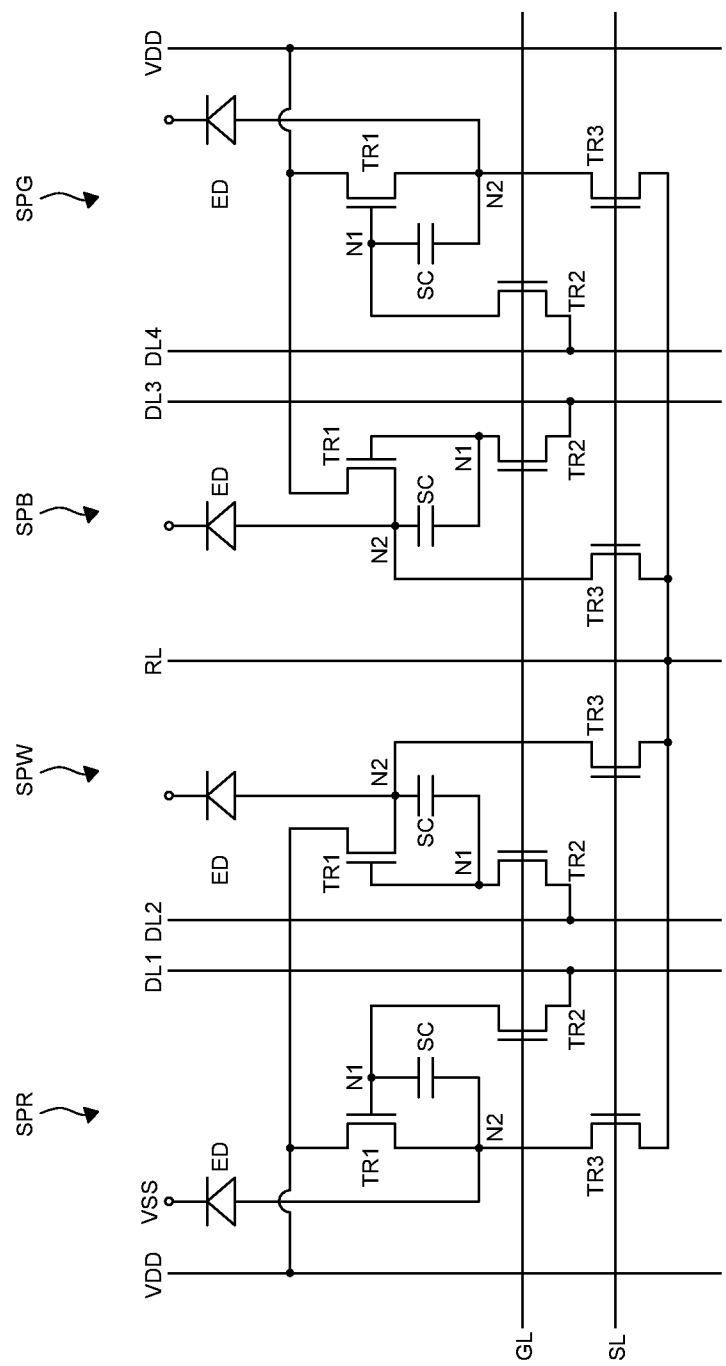
FIG. 2 is a circuit diagram of a sub pixel of a portion A of FIG. 1 according to an exemplary embodiment of the present disclosure.

FIG. 2 is a circuit diagram of a sub pixel of a portion A of FIG. 1 according to one embodiment.

Referring to FIG. 2, the plurality of sub pixels SP includes a red sub pixel SPR, a white sub pixel SPW, a blue sub pixel SPB, and a green sub pixel SPG. Further, the driving circuit for driving the light emitting diodes ED of sub pixels SPR, SPW, SPB, SPG includes a first transistor TR1, a second transistor TR2, a third transistor TR3, and a storage capacitor SC. In order to drive the driving circuit, a plurality of wiring lines including a gate line GL, a data line DL, a high potential power line VDD, a sensing line SL, and a reference line RL is disposed on the substrate 110. Each sub pixel SPR, SPW, SPB, SPG has the same structure so that the red sub pixel SPR will be described below as a reference.

Each of the first transistor TR1, the second transistor TR2, and the third transistor TR3 included in the driving circuit of the red sub pixel SPR includes a gate electrode, a source electrode, and a drain electrode.

The first transistor TR1, the second transistor TR2, and the third transistor TR3 may be P-type thin film transistors or N-type thin film transistors. For example, since in the P-type thin film transistor, holes flow from the source electrode to the drain electrode, the current flows from the source electrode to the drain electrode. Since in the N-type thin film transistor, electrons flow from the source electrode to the drain electrode, the current flows from the drain electrode to the source electrode. Hereinafter, the description will be made under the assumption that the first transistor TR1, the second transistor TR2, and the third transistor TR3 are N-type thin film transistors in which the current flows from the drain electrode to the source electrode, but the present disclosure is not limited thereto.

The first transistor TR1 includes a first active layer, a first gate electrode, a first source electrode, and a first drain electrode. The first gate electrode is connected to a first node N1, the first source electrode is connected to the anode of the light emitting diode ED, and the first drain electrode is connected to the high potential power line VDD. When a voltage of the first node N1 is greater than a threshold voltage, the first transistor TR1 is turned on and when the voltage of the first node N1 is less than the threshold voltage, the first transistor TR1 is turned off. When the first transistor TR1 is turned on, a driving current may be transmitted to the light emitting diode ED through the first transistor TR1. Therefore, the first transistor TR1 which controls the driving current transmitted to the light emitting diode ED may be referred to as a driving transistor.

The second transistor TR2 includes a second active layer, a second gate electrode, a second source electrode, and a second drain electrode. The second gate electrode is connected to the gate line GL, the second source electrode is connected to the first node N1, and the second drain electrode is connected to a first data line DLL The second transistor TR2 may be turned on or off based on a gate voltage from the gate line GL. When the second transistor TR2 is turned on, a data voltage from the data line DL may be charged in the first node N1. Therefore, the second transistor TR2 which is turned on or turned off by the gate line GL may also be referred to as a switching transistor.

In the meantime, in the case of the white sub pixel SPW, a second drain electrode of the second transistor TR2 is connected to a second data line DL2, in the case of the blue sub pixel SPB, a second drain electrode of the second transistor TR2 is connected to a third data line DL3, and in the case of the green sub pixel SPG, a second drain electrode of the second transistor TR2 is connected to a fourth data line DL4.

The third transistor TR3 includes a third active layer, a third gate electrode, a third source electrode, and a third drain electrode. The third gate electrode is connected to the sensing line SL, the third source electrode is connected to the second node N2, and the third drain electrode is connected to the reference line RL. The third transistor TR3 may be turned on or off based on a sensing voltage from the sensing line SL. When the third transistor TR3 is turned on, a reference voltage Vref from the reference line RL may be transmitted to the second node N2 and the storage capacitor SC. Therefore, the third transistor TR3 may also be referred to as a sensing transistor.

Figure 3:
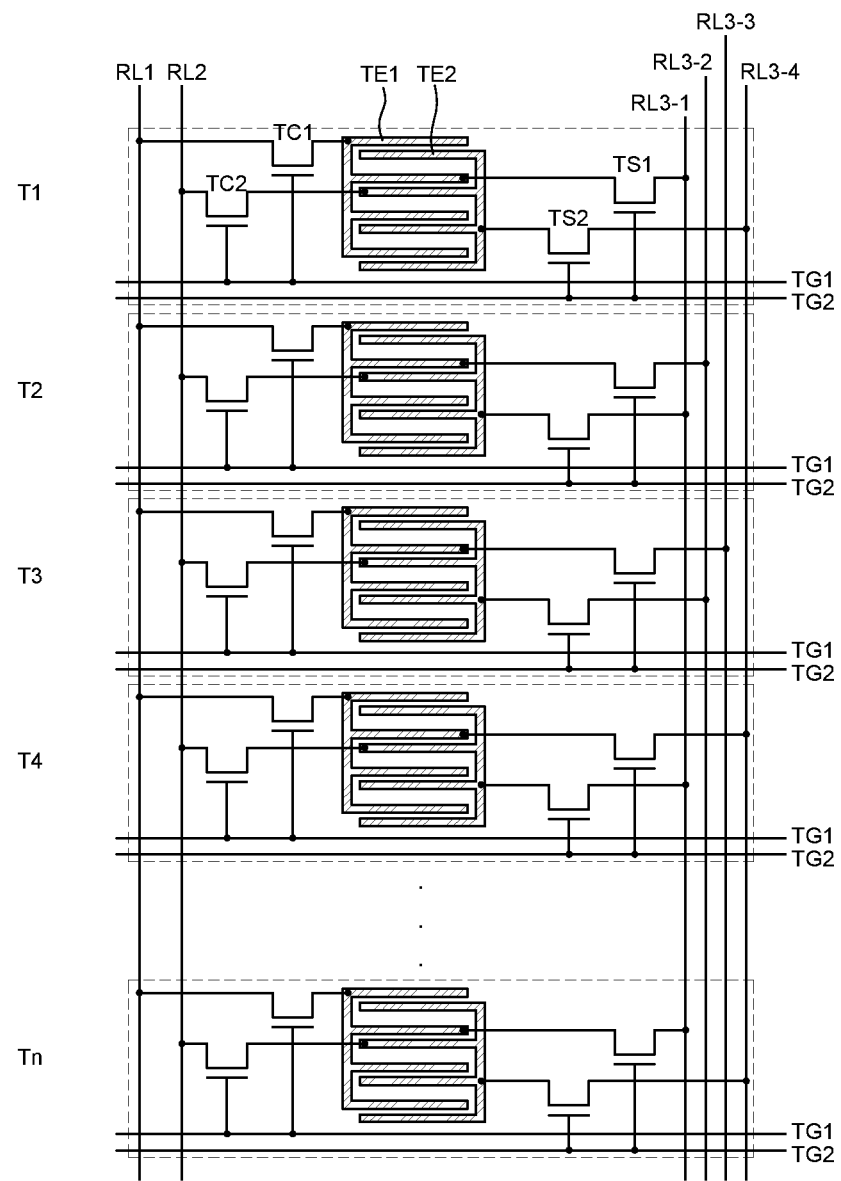
FIG. 3 is a diagram of a touch electrode of a display device according to an exemplary embodiment of the present disclosure.

In the meantime, even though in FIG. 3, it is illustrated that the gate line GL and the sensing line SL are separate wiring lines, the gate line GL and the sensing line SL may be implemented as one wiring line, but it is not limited thereto.

The storage capacitor SC is connected between the first gate electrode and the first source electrode of the first transistor TR1. That is, the storage capacitor SC may be connected between the first node N1 and the second node N2. The storage capacitor SC maintains a potential difference between the first gate electrode and the first source electrode of the first transistor TR1 while the light emitting diode ED emits light, so that a constant driving current may be supplied to the light emitting diode ED. The storage capacitor SC includes a plurality of capacitor electrodes and for example, one of a plurality of capacitor electrodes is connected to the first node N1 and the other one is connected to the second node N2.

The light emitting diode ED includes an anode, an emission layer, and a cathode. The anode of the light emitting diode ED is connected to the second node N2 and the cathode is connected to the low potential power line VSS. The light emitting diode ED is supplied with a driving current from the first transistor TR1 to emit light.

In the meantime, in FIG. 2, it is described that the driving circuit of each sub pixel SPR, SPW, SPB, SPG of the display device 100 according to the exemplary embodiment of the present disclosure has a 3T1C structure including three transistors and one storage capacitor SC. However, the number and a connection relationship of the transistors and the storage capacitor may vary in various ways depending on the design and are not limited thereto.

Figure 4:
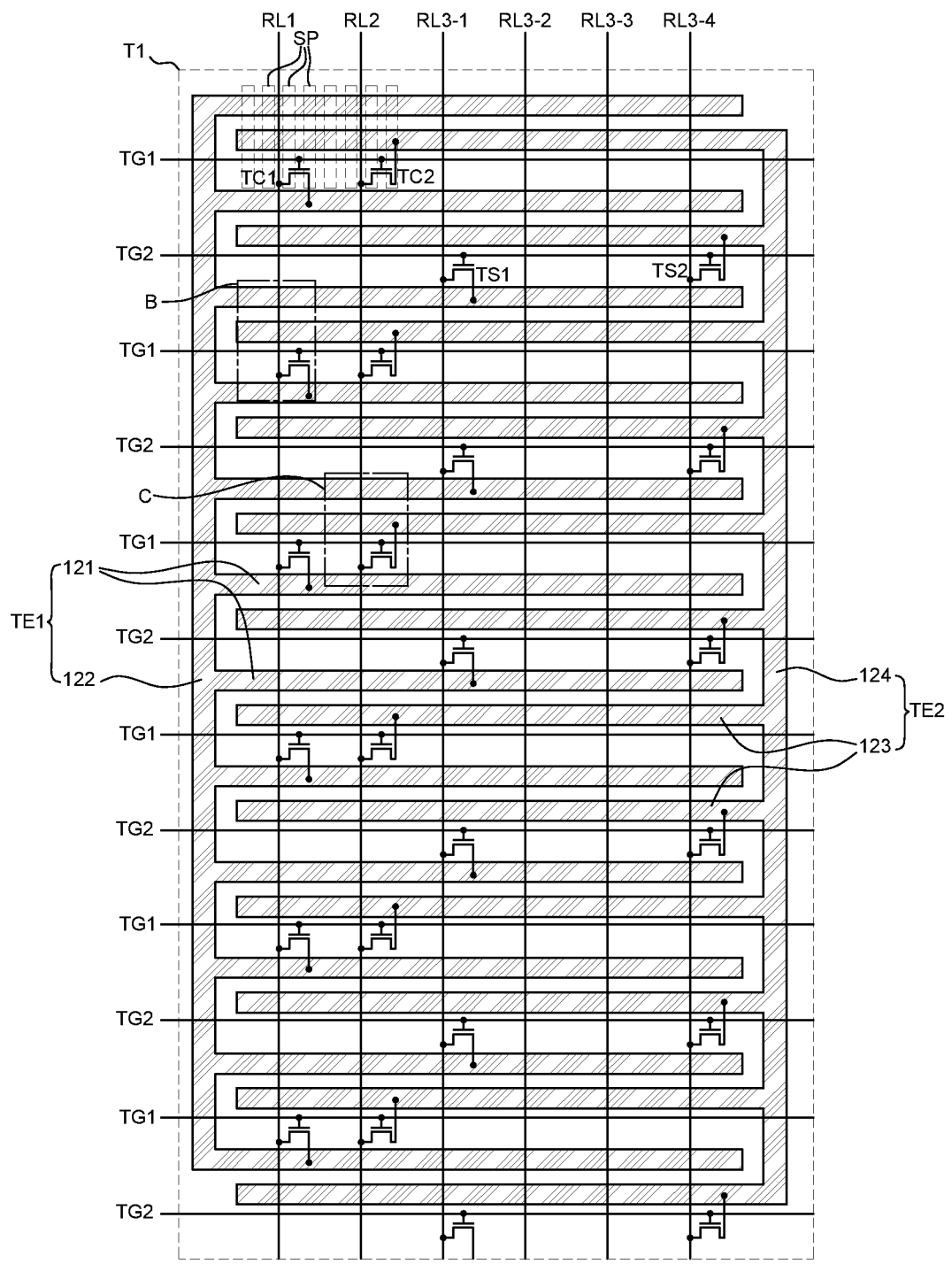
FIG. 4 is an enlarged view of a portion T1 of FIG. 3 according to an exemplary embodiment of the present disclosure.

FIG. 3 is a diagram of a touch electrode of a display device according to an exemplary embodiment of the present disclosure. FIG. 4 is an enlarged view of a portion T1 of FIG. 3 according to an exemplary embodiment of the present disclosure. In FIG. 3, for the convenience of description, touch electrodes TE1, TE2, transistors for touching TC1, TC2, TS1, TS2, touch gate lines TG1, TG2, and six reference lines RL1, RL2, RL3-1, RL3-2, RL3-3, RL3-4 are simply illustrated.

Referring to FIGS. 3 and 4, the display device 100 according to the exemplary embodiment of the present disclosure includes a plurality of touch electrode blocks T1, T2, T3, T4, . . . , Tn. The plurality of touch electrode blocks T1, T2, T3, T4, . . . , Tn may be arranged in the first direction and the second direction while overlapping the plurality of sub pixels SP in the active area AA. The plurality of touch electrode blocks T1, T2, T3, T4, . . . , Tn has the same structure so that the first touch electrode block T1 will be described below as a reference.

The touch electrode block T1 includes a first touch electrode TE1, a second touch electrode TE2, and a plurality of transistors for touching TC1, TC2, TS1, TS2. Further, the plurality of transistors for touching TC1, TC2, TS1, TS2 is connected to a first reference line RL1, a second reference line RL2, a plurality of third reference lines RL3-1, RL3-2, RL3-3, RL3-4, a first touch gate line TG1, and a second touch gate line TG2.

The first touch electrode TE1 includes a plurality of first sub electrodes 121 extending in the first direction and a first connection electrode 122 which extends in the second direction to connect together the plurality of first sub electrodes 121. The plurality of first sub electrodes 121 may be disposed to be spaced apart from each other in the second direction. Each of the plurality of first sub electrodes 121 may overlap the plurality of sub pixels SP disposed in the first direction.

The second touch electrode TE2 is disposed to be spaced apart from the first touch electrode TEE The second touch electrode TE2 includes a plurality of second sub electrodes 123 which extends in the first direction and a second connection electrode 124 which extends in the second direction to connect together the plurality of second sub electrodes 123. The plurality of second sub electrodes 123 may be disposed to be spaced apart from each other in the second direction. Each of the plurality of second sub electrodes 123 may overlap the plurality of sub pixels SP disposed in the first direction.

The plurality of first sub electrodes 121 and the plurality of second sub electrodes 123 may be alternately disposed in the second direction. That is, the second sub electrodes 123 are interleaved between the first sub electrodes 121 such that at least one first sub electrode is disposed between two second sub electrodes. Further, in one sub pixel SP, one of the plurality of first sub electrodes 121 and one of the plurality of second sub electrodes 123 are disposed. In one embodiment, the first sub electrode 121 is disposed above the sub pixel SP and the second sub electrode 123 is disposed below the sub pixel SP, but the positions of the first sub electrode 121 and the second sub electrode 123 are not limited thereto.

The plurality of transistors for touching TC1, TC2, TS1, TS2 includes a first charging transistor TC1, a second charging transistor TC2, a first sensing transistor TS1, and a second sensing transistor TS2.

The first charging transistor TC1 includes a fourth active layer, a fourth gate electrode, a fourth source electrode, and a fourth drain electrode. The fourth gate electrode is connected to the first touch gate line TG1, the fourth source electrode is connected to the first touch electrode TE1, and the fourth drain electrode is connected to the first reference line RL1. The first charging transistor TC1 is turned on or off based on a first touch gate signal from the first touch gate line TG1. When the first charging transistor TC1 is turned on, a first touching voltage from the first reference line RL1 is charged in the first touch electrode TE1.

The second charging transistor TC2 includes a fifth active layer, a fifth gate electrode, a fifth source electrode, and a fifth drain electrode. The fifth gate electrode is connected to the first touch gate line TG1, the fifth source electrode is connected to the second touch electrode TE2, and the fifth drain electrode is connected to the second reference line RL2. The second charging transistor TC2 is turned on or off based on the first touch gate signal from the first touch gate line TG1. When the second charging transistor TC2 is turned on, a second touching voltage from the second reference line RL2 is charged in the second touch electrode TE2.

The first sensing transistor TS1 includes a sixth active layer, a sixth gate electrode, a sixth source electrode, and a sixth drain electrode. The first sensing transistor TS1 has the same structure as the first charging transistor TC1. Specifically, the sixth gate electrode is connected to the second touch gate line TG2, the sixth drain electrode is connected to the first touch electrode TE1, and the sixth source electrode is connected to the 3-1st reference line RL3-1. The first sensing transistor TS1 is turned on or off based on a second touch gate signal from the second touch gate line TG2. When the first sensing transistor TS1 is turned on, the touch sensing signal from the first touch electrode TE1 is sensed to the 3-1st reference line RL3-1.

The second sensing transistor TS2 includes a seventh active layer, a seventh gate electrode, a seventh source electrode, and a seventh drain electrode. The second sensing transistor TS2 has the same structure as the second charging transistor TC2. Specifically, the seventh gate electrode is connected to the second touch gate line TG2, the seventh drain electrode is connected to the second touch electrode TE2, and the seventh source electrode is connected to the 3-4th reference line RL3-4. The second sensing transistor TS2 is turned on or off based on a second touch gate signal from the second touch gate line TG2. When the second sensing transistor TS2 is turned on, the touch sensing signal from the second touch electrode TE2 is sensed to the 3-4th reference line RL3-4.

In the meantime, in the present disclosure, it is assumed that the first charging transistor TC1, the second charging transistor TC2, the first sensing transistor TS1, and the second sensing transistor TS2 are N type thin film transistors in which the current flows from the drain electrodes to the source electrodes, but it is not limited thereto.

A plurality of first charging transistors TC1, a plurality of second charging transistors TC2, a plurality of first sensing transistors TS1, and a plurality of second sensing transistors TS2 may be provided. That is, in one touch electrode block T1, not one first charging transistor, one second charging transistor, one first sensing transistor, and one second sensing transistor, but the plurality of first charging transistors TC1, second charging transistors TC2, first sensing transistors TS1, and second sensing transistors TS2 may be provided. Therefore, in one touch electrode block T1, the plurality of first charging transistors TC1, second charging transistors TC2, first sensing transistors TS1, and second sensing transistors TS2 are provided so that the load is suppressed to be concentrated in each of the first charging transistors TC1, second charging transistors TC2, first sensing transistors TS1, and second sensing transistors TS2 of the touch electrode block T1.

A plurality of first touch gate lines TG1 and a plurality of second touch gate lines TG2 are provided. At this time, the plurality of first touch gate lines TG1 disposed in one touch electrode block T1 is electrically connected to each other to apply the same first touch gate signal to the plurality of first charging transistors TC1 and the plurality of second charging transistors TC2. Further, the plurality of second touch gate lines TG2 disposed in one touch electrode block T1 is electrically connected to each other to apply the same second touch gate signal to the plurality of first sensing transistors TS1 and the plurality of second sensing transistors TS2.

The first touch gate lines TG1 and the second touch gate lines TG2 extend in the first direction. Further, the first touch gate lines TG1 and the second touch gate lines TG2 are alternately disposed. For example, one of the first touch gate line TG1 and the second touch gate line TG2 is disposed between the plurality of sub pixels which is adjacent to each other in the second direction. Further, the first touch gate line TG1 is disposed between the plurality of sub pixels SP in the first line and the plurality of sub pixels SP in the second line and the second touch gate line TG2 is disposed between the plurality of sub pixels SP in the second line and the plurality of sub pixels SP in the third line. This structure is alternately repeated. Alternatively, one first sub electrode 121 and one second sub electrode 123 form one sub electrode pair and one of the first touch gate line TG1 and the second touch gate line TG2 is disposed between sub electrode pairs which are adjacent to each other in the second direction. Further, the first touch gate line TG1 is disposed between the first sub electrode pair and the second sub electrode pair and the second touch gate line TG2 is disposed between the second sub electrode pair and the third sub electrode pair, and this structure is alternately repeated.

The first reference line RL1, the second reference line RL2, and the plurality of third reference lines RL3-1, RL3-2, RL3-3, and RL3-4 extend in the second direction. The first reference line RL1, the second reference line RL2, and the plurality of third reference lines RL3-1, RL3-2, RL3-3, and RL3-4 may be the same reference line RL described in FIG. 2. That is, the reference line RL applies a reference voltage Vref to the plurality of sub pixels SP during the display period and transmits or receives signals for touching to or from the first touch electrode TE1 and the second touch electrode TE2 during the touch period. One first reference line RL1 which applies the first touching voltage to the first touch electrode TE1 is provided and one second reference line RL2 which applies the second touching voltage to the second touch electrode TE2 is provided. Further, a plurality of third reference lines RL3-1, RL3-2, RL3-3, and RL3-4 which transmits the touch sensing signals from the first touch electrode TE1 and the second touch electrode TE2 is provided. In the meantime, the third reference lines RL3-1, RL3-2, RL3-3, and RL3-4 may be wiring lines branched from the multiplexer MUX. At this time, the multiplexer MUX is disposed at the edge of the substrate 110, but the present disclosure is not limited thereto.

The first sensing transistor TS1 connected to the first touch electrode TE1 and the second sensing transistor TS2 connected to the second touch electrode TE2 are connected to different wiring lines among the plurality of third reference lines RL3-1, RL3-2, RL3-3, and RL3-4. Therefore, voltages of the first touch electrode TE1 and the second touch electrode TE2 may be sensed individually through different third reference lines RL3-1, RL3-2, RL3-3, and RL3-4. For example, as illustrated in FIGS. 3 and 4, all the first sensing transistors TS1 of the first touch electrode block T1 are connected to the 3-1-th reference line RL3-1 and all the second sensing transistors TS2 are connected to the 3-4-th reference line RL3-4. Further, as illustrated in FIG. 3, all the first sensing transistors TS1 of the second touch electrode block T2 are connected to the 3-2nd reference line RL3-2 and all the second sensing transistors TS2 are connected to the 3-1st reference line RL3-1. However, the connection relationship of the sensing transistors TS1 and TS2 and the third reference lines RL3-1, RL3-2, RL3-3, RL3-4 is not limited to those illustrated in FIGS. 3 and 4.

In the meantime, the number of first sub electrodes 121, second sub electrodes 123, first charging transistors TC1, second charging transistors TC2, first sensing transistors TS1, second sensing transistors TS2, first touch gate lines TG1, second touch gate lines TG2, third reference lines RL3-1, RL3-2, RL3-3, and RL3-4 is not limited to the number illustrated in FIG. 4. That is, the number may vary depending on the design.

Figure 5:
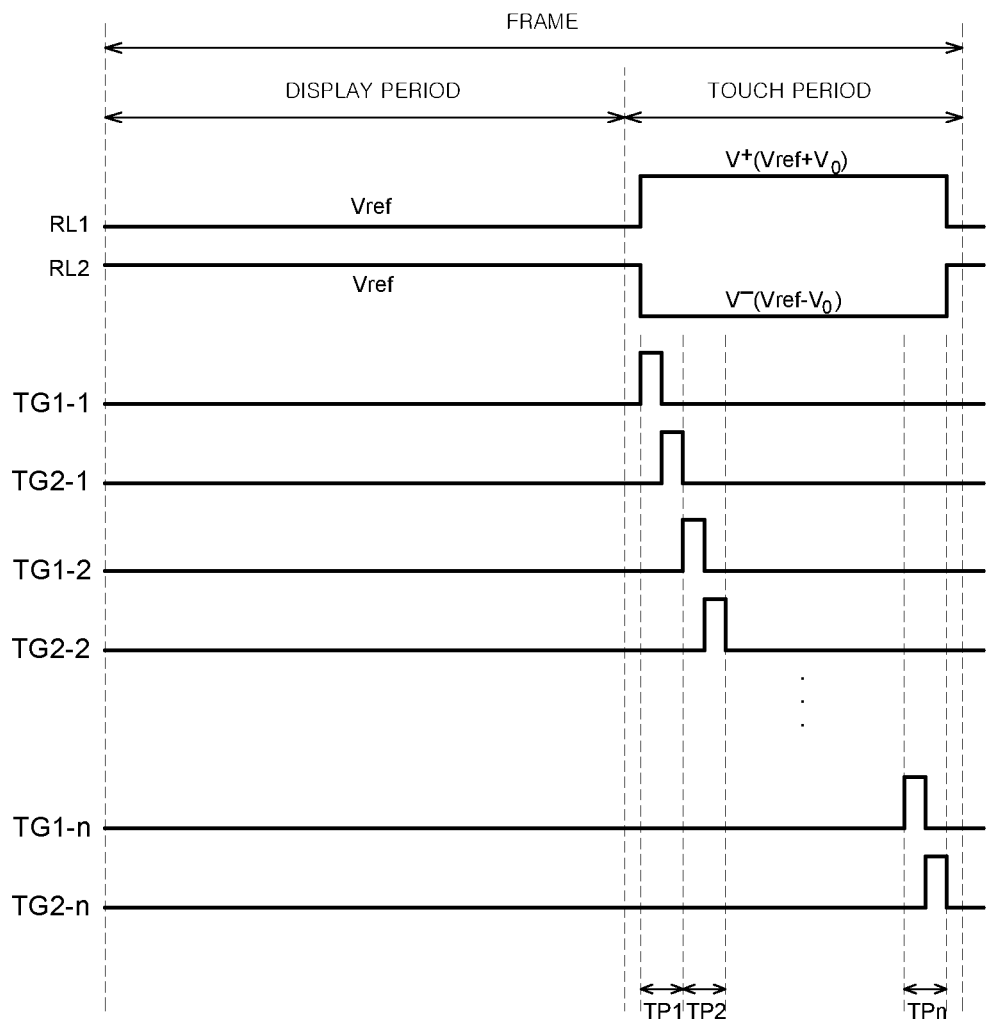
FIG. 5 illustrates a schematic operation timing for explaining a driving method of a display device according to an exemplary embodiment of the present disclosure.

FIG. 5 illustrates a schematic operation timing for explaining a driving method of a display device according to an exemplary embodiment of the present disclosure. In FIG. 5, for the convenience of description, signals of two reference lines RL1 and RL2 and the first touch gate lines TG1-1, TG1-2, ..., TG1-n and the second touch gate lines TG2-1, TG2-2, ..., TG2-n included in each of the plurality of touch electrode blocks T1, T2, T3, T4, ..., Tn are schematically illustrated. Here, TG1-n and TG2-n denote the first touch gate line TG1 and the second touch gate line TG2 of the n-th touch electrode block Tn, respectively.

Referring to FIG. 5, the display device 100 is time-divisionally driven in the display period and the touch period in one frame. Here, the touch period includes a plurality of touch periods TP1, TP2, ..., TPn. Specifically, the n-th touch period TPn may refer to a period in which signals are applied to a first touch gate line TG1-n and a second touch gate line TG2-n of the n-th touch electrode block Tn.

First, in the display period, the same reference voltage Vref is applied to the plurality of sub pixels SP in the first reference line RL1, the second reference line RL2, and the third reference lines RL3-1, RL3-2, RL3-3, RL3-4. Further, even though not illustrated, during the display period, the gate signal may be applied to the plurality of gate lines GL. At this time, the first touch gate lines TG1-1, TG1-2, ..., TG1-n and the second touch gate lines TG2-1, TG2-2, ..., TG2-n are wiring lines to apply the touch gate signal in the touch period. Therefore, during the display period, a low level signal is input so that the plurality of transistors for touching TC1, TC2, TS1, TS2 is turned off.

During the touch period, a first touching voltage $V^+$ is applied to the first reference line RL1 and a second touching voltage $V^-$ is applied to the second reference line RL2. Here, the first touching voltage $V^+$ is a sum (Vref+V0) of the reference voltage Vref and a predetermined voltage V0 and the second touching voltage $V^-$ is a difference (Vref−V0) of the reference voltage Vref and a predetermined voltage V0. At this time, the predetermined voltage V0 is an arbitrary voltage value and may be freely set depending on the design. Further, the first touch gate signal and the second touch gate signal may be sequentially applied to the first touch gate lines TG1-1, TG1-2, ..., TG1-n and the second touch gate lines TG2-1, TG2-2, ..., TG2-n. At this time, during each of the plurality of touch periods TP1, TP2, ..., TPn, the first touch gate signal and the second touch gate signal are inverted signals. For example, during the first touch period TP1, the first touch gate signal and the second touch gate signal applied to the first touch gate line TG1-1 and the second touch gate line TG2-1 of the first touch electrode block T1 may be inverted signals from each other. During the remaining touch period excluding the first touch period TP1, a signal for turning off the touching transistors TC1, TC2, TS1, TS2 is applied to both the first touch gate line TG1-1 and the second touch gate line TG2-1 of the first touch electrode block T1.

To be more specific, a high level of first touch gate signal is applied to the first touch gate line TG1-1 of the first touch electrode block T1. Therefore, the first charging transistor TC1 and the second charging transistor TC2 of the first touch electrode block T1 are turned on. The first touching voltage $V^+$ and the second touching voltage $V^-$ are charged in the first touch electrode TE1 and the second touch electrode TE2 through the first reference line RL1 and the second reference line RL2, respectively.

Next, a high level of second touch gate signal is applied to the second touch gate line TG2-1 of the first touch electrode block T1. Therefore, the first sensing transistor TS1 and the second sensing transistor TS2 of the first touch electrode block T1 are turned on. The touch sensing signal from the first touch electrode TE1 is sensed by the third reference line RL3-1 connected to the first sensing transistor TS1 and the touch sensing signal from the second touch electrode TE2 is sensed by the third reference line RL3-4 connected to the second sensing transistor TS2. At this time, a low level of first touch gate signal is applied to the first touch gate line TG1-1 so that the first charging transistor TC1 and the second charging transistor TC2 are turned off.

After sensing the signal in the first touch electrode block T1, a high level of touch gate signal is sequentially applied to the first touch gate line TG1-2 and the second touch gate line TG2-2 of the second touch electrode block T2. This operation may be sequentially performed to the n-th touch electrode block Tn. However, even though in FIG. 5, it is described that the sensing in the touch electrode blocks T1, T2, T3, T4, ..., Tn is sequentially performed, the present disclosure is not limited thereto. That is, the touch sensing may be simultaneously performed in the plurality of touch electrode blocks T1, T2, T3, T4, ..., Tn.

If the touch is performed in an area corresponding to a specific touch electrode block, voltages of the first touch electrode TE1 and the second touch electrode TE2 may vary. That is, a predetermined first touching voltage $V^+$ and second touching voltage $V^-$ are applied to the first touch electrode TE1 and the second touch electrode TE2 so that when the touch is not performed, the sensed voltage value may be within a predetermined range at all times. When a finger of the user is located to be adjacent to the first touch electrode TE1 or the second touch electrode TE2 of a specific touch electrode block, a quantity of electric charges of the first touch electrode TE1 and the second touch electrode TE2 is changed. Specifically, when the voltage value sensed from the first touch electrode TE1 and the second touch electrode TE2 is equal to or larger than a predetermined range, it is determined that the touch operation is performed in an area corresponding to the specific touch electrode block.

Figure 6A:
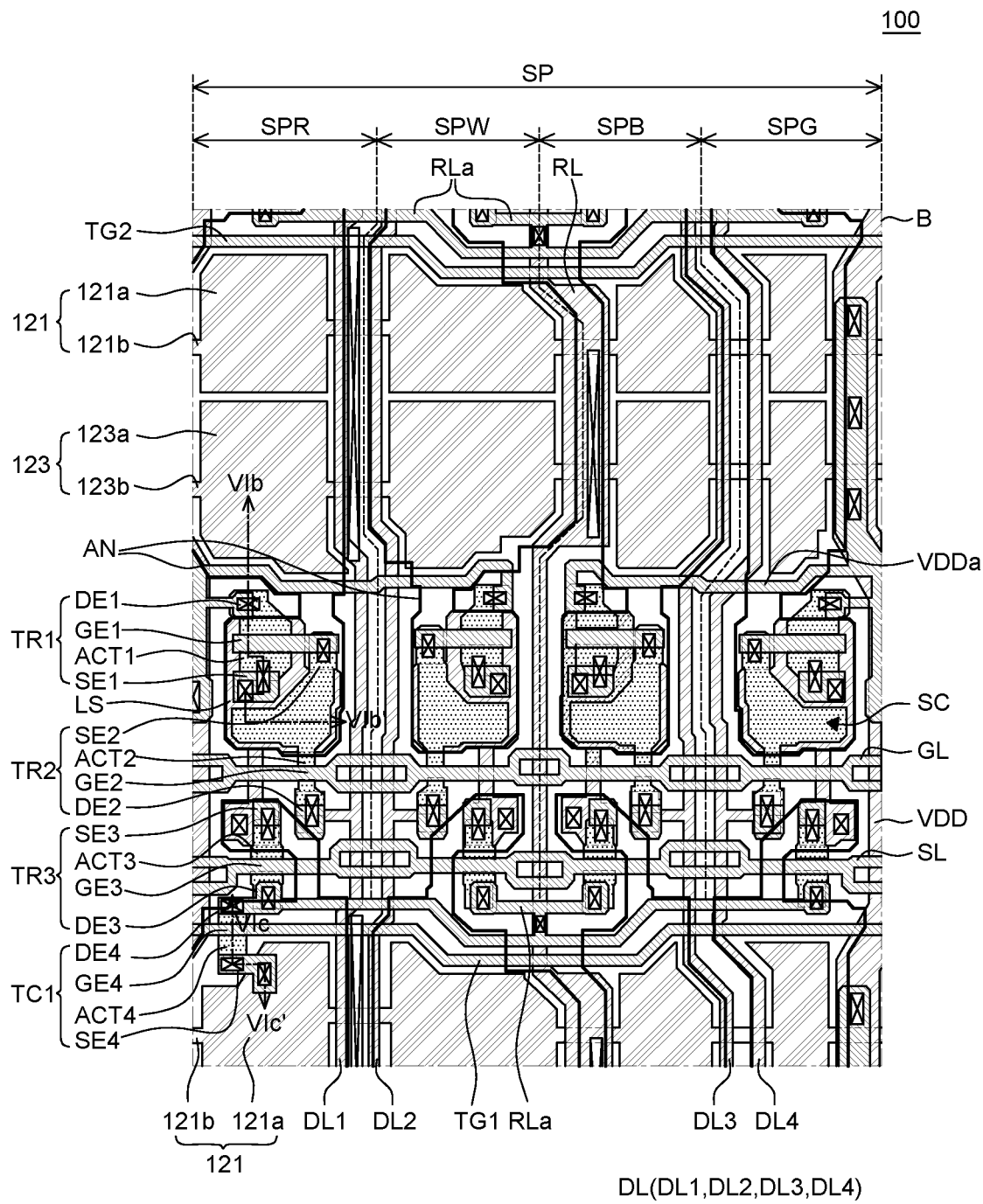
FIG. 6A is an enlarged plan view of a portion B of FIG. 4 according to an exemplary embodiment of the present disclosure.
Figure 6B:
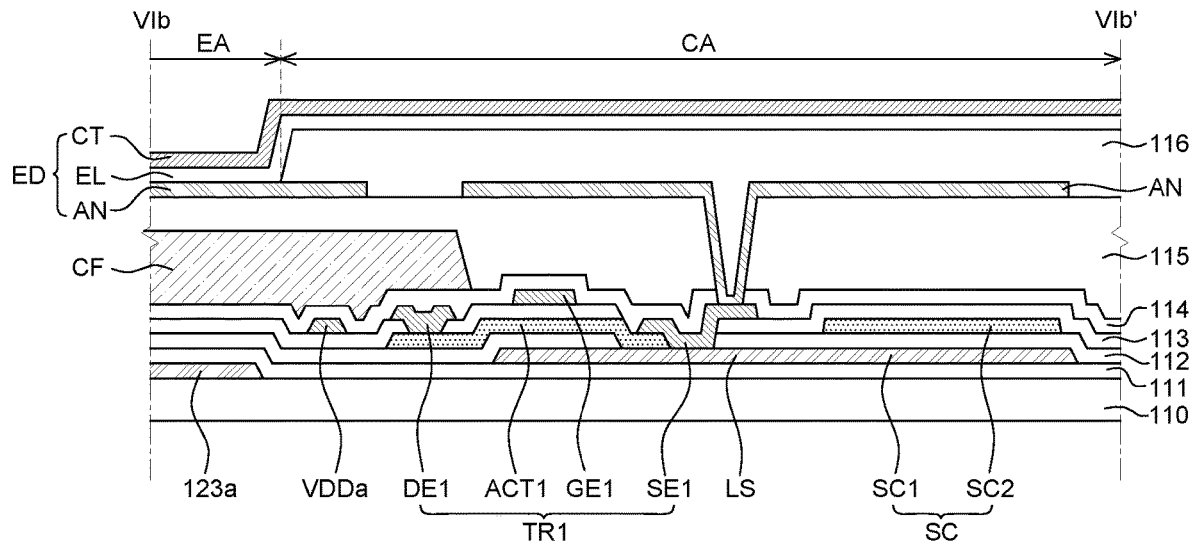
FIG. 6B is a cross-sectional view taken along VIb-VIb' of FIG. 6A according to an exemplary embodiment of the present disclosure.
Figure 6C:
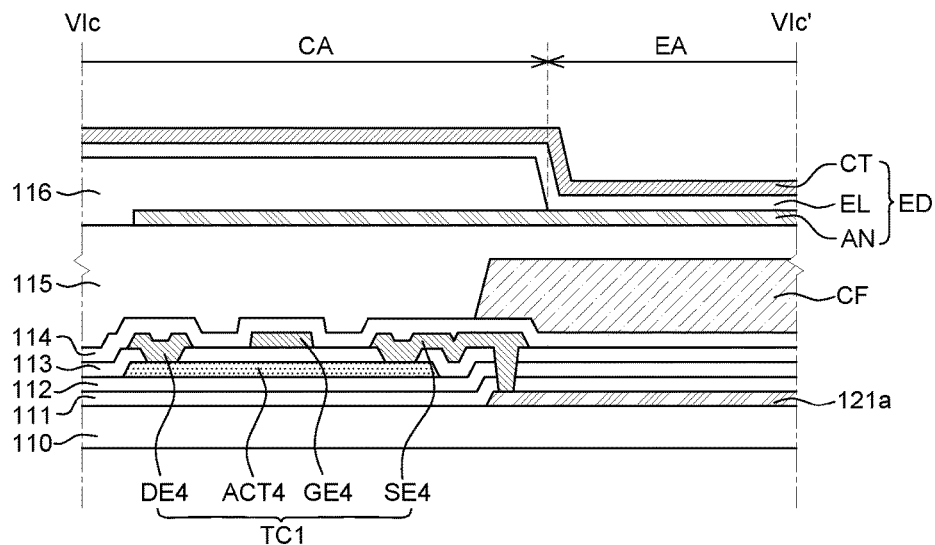
FIG. 6C is a cross-sectional view taken along VIc-VIc' of FIG. 6A according to an exemplary embodiment of the present disclosure.

FIG. 6A is an enlarged plan view of a portion B of FIG. 4 according to one embodiment. FIG. 6B is a cross-sectional view taken along VIb-VIb' of FIG. 6A according to one embodiment. FIG. 6C is a cross-sectional view taken along VIc-VIc' of FIG. 6A. FIG. 6A is an enlarged plan view of a red sub pixel SPR, a white sub pixel SPW, a blue sub pixel SPB, and a green sub pixel SPG which configure one pixel.

Referring to FIGS. 6A to 6C, the display device 100 according to the exemplary embodiment of the present disclosure includes a substrate 110, a first touch electrode TE1, a second touch electrode TE2, a first transistor TR1, a second transistor TR2, a third transistor TR3, a storage capacitor SC, a first charging transistor TC1, a second charging transistor TC2, a first sensing transistor TS1, a second sensing transistor TS2, a light emitting diode ED, a gate line GL, a sensing line SL, a first touch gate line TG1, a second touch gate line TG2, a data line DL, a reference line RL, a high potential power line VDD, and a color filter CF. In FIGS. 6A to 6C, among the plurality of transistors for touching TC1, TC2, TS1, TS2, the first charging transistor TC1 is illustrated and among the touch electrodes TE1 and TE2, the first sub electrode 121 and the second sub electrode 123 are illustrated.

Referring to FIG. 6A, the plurality of sub pixels SP includes a red sub pixel SPR, a green sub pixel SPG, a blue sub pixel SPB, and a white sub pixel SPW. For example, the red sub pixel SPR, the white sub pixel SPW, the blue sub pixel SPB, and the green sub pixel SPG may be sequentially disposed along a first direction. However, the placement order of the plurality of sub pixels SP is not limited thereto.

Each of the plurality of sub pixels SP includes an emission area EA and a circuit area CA. The emission area EA is an area where one color light is independently emitted and the light emitting diode ED may be disposed therein. Specifically, an area which is exposed from the bank 116 and allows light emitted from the light emitting diode ED to travel to the outside may be defined as the emission area EA. For example, as illustrated in FIGS. 6B and 6C, the anode AN is exposed by the bank 116 so that an area where the anode AN and the emission layer EL are in direct contact with each other may be an emission area EA.

The circuit area CA is an area excluding the emission area EA and a driving circuit for driving the plurality of light emitting diodes ED and a plurality of wiring lines which transmits various signals to the driving circuit may be disposed. The circuit area CA in which the driving circuit, the plurality of wiring lines, and the bank 116 are disposed may be a non-emission area. For example, in the circuit area CA, a driving circuit including the first transistor TR1, the second transistor TR2, the third transistor TR3, the storage capacitor SC, the first charging transistor TC1, the second charging transistor TC2, the first sensing transistor TS1, and the second sensing transistor TS2, a plurality of high potential power line VDD, a plurality of data lines DL, a plurality of reference lines RL, a plurality of gate lines GL, a sensing line SL, a plurality of touch gate lines TG1 and TG2, and a bank 116 are disposed.

Referring to FIGS. 6A to 6C, the first touch electrode TE1 and the second touch electrode TE2 are disposed on the substrate 110. As show in FIGS. 6A to 6C, the first touch electrode TE1 and the second touch electrode TE2 are closer to the substrate than the light emitting diode ED. Specifically, the first sub electrode 121 of the first touch electrode TE1 and the second sub electrode 123 of the second touch electrode TE2 may be disposed to extend along the first direction in the plurality of sub pixels SP.

The first sub electrode 121 includes a first main electrode unit 121a overlapping the anode AN in the emission area EA of each of the plurality of sub pixels SP and a first connection unit 121b which connects to the first main electrode unit 121a. The first main electrode unit 121a may be formed to have a larger area than the first connection unit 121b. The first connection unit 121b may be disposed in the circuit area CA between the emission areas EA of adjacent sub pixels SP to connect a first main electrode unit 121a of a first subpixel to another first main electrode unit 121a of an adjacent second subpixel SP.

The second sub electrode 123 includes a second main electrode unit 123a overlapping the anode AN in the emission area EA of each of the plurality of sub pixels SP and a second connection unit 123b which connects to the second main electrode unit 123a. The second main electrode unit 123a may be formed to have a larger area than the second connection unit 123b. The second connection unit 123b may be disposed in the circuit area CA between the emission areas EA of adjacent sub pixels SP. Further, the second sub electrode 123 may further include an extension unit 123c which extends from the second connection unit 123b to be electrically connected to the second charging transistor TC2, which will be described below with reference to FIGS. 7A to 7C.

In the emission area EA of one sub pixel SP, both the first sub electrode 121 and the second sub electrode 123 are disposed. Specifically, as illustrated in FIG. 6A, the first sub electrode 121 and the second sub electrode 123 are disposed above and below each other in the emission area EA, respectively. However, the positions of the first sub electrode 121 and the second sub electrode 123 are not limited thereto.

The first touch electrode TE1 and the second touch electrode TE2 are formed of a transparent conductive material. Therefore, light emitted from the light emitting diode ED may pass through the first touch electrode TE1 and the second touch electrode TE2 to be easily emitted. The first touch electrode TE1 and the second touch electrode TE2 may be configured by a transparent conducting oxide (TCO) such as indium tin oxide (ITO), indium zinc oxide (IZO), or indium zinc tin oxide (ITZO) or a transparent oxide semiconductor such as indium gallium zinc oxide (IGZO), indium gallium oxide (IGO), or indium tin zinc oxide (ITZO), but is not limited thereto.

In the meantime, even though it is not illustrated, a buffer layer may be disposed between the substrate 110 and the touch electrodes TE1 and TE2. The buffer layer may reduce permeation of moisture or impurities through the substrate 110. The buffer layer may be configured by a single layer or a double layer of silicon oxide SiOx or silicon nitride SiNx, but is not limited thereto. Further, the buffer layer may be omitted depending on a type of the substrate 110 or a type of the transistor, but is not limited thereto.

Referring to FIGS. 6B and 6C, a first insulating layer 111 is disposed on the touch electrodes TE1 and TE2. The first insulating layer 111 is a layer for insulating components disposed above and below the first insulating layer 111 and may be formed of an insulating material. For example, the first insulating layer 111 may be configured by a single layer or a double layer of silicon oxide SiOx or silicon nitride SiNx, but is not limited thereto.

Referring to FIGS. 6A to 6C, a plurality of high potential power lines VDD, a plurality of data lines DL, a plurality of reference lines RL, and a light shielding layer LS are disposed on the first insulating layer 111.

The plurality of high potential power lines VDD, the plurality of data lines DL, the plurality of reference lines RL, and the light shielding layer LS are disposed on the same layer of the first insulating layer 111 and formed of the same conductive material. For example, the plurality of high potential power lines VDD, the plurality of data lines DL, the plurality of reference lines RL, and the light shielding layer LS may be configured by a conductive material such as copper (Cu), aluminum (Al), molybdenum (Mo), nickel (Ni), titanium (Ti), chrome (Cr), or an alloy thereof, but are not limited thereto.

The plurality of high potential power lines VDD are wiring lines which transmit the high potential power signal to each of the plurality of sub pixels SP. The plurality of high potential power lines VDD extends in the second direction between the plurality of sub pixels SP. Two sub pixels SP which are adjacent to each other in the first direction may share one high potential power line VDD among the plurality of high potential power lines VDD. For example, one high potential power line VDD is disposed at a left side of the red sub pixel SPR to supply a high potential power voltage to the first transistor TR1 of each of the red sub pixel SPR and the white sub pixel SPW. The other high potential power line VDD is disposed at a right side of the green sub pixel SPG to supply a high potential power voltage to the first transistor TR1 of each of the blue sub pixel SPB and the green sub pixel SPG.

The plurality of data lines DL extends between the plurality of sub pixels SP in the second direction to transmit a data voltage to each of the plurality of sub pixels SP. The plurality of data lines DL includes a first data line DL1, a second data line DL2, a third data line DL3, and a fourth data line DL4. The first data line DL1 is disposed between the red sub pixel SPR and the white sub pixel SPW to transmit a data voltage to the second transistor TR2 of the red sub pixel SPR. The second data line DL2 is disposed between the first data line DL1 and the white sub pixel SPW to transmit the data voltage to the second transistor TR2 of the white sub pixel SPW. The third data line DL3 is disposed between the blue sub pixel SPB and the green sub pixel SPG to transmit a data voltage to the second transistor TR2 of the blue sub pixel SPB. The fourth data line DL4 is disposed between the third data line DL3 and the green sub pixel SPG to transmit the data voltage to the second transistor TR2 of the green sub pixel SPG.

The plurality of reference lines RL extends between the plurality of sub pixels SP in the second direction to transmit the reference voltage Vref to each of the plurality of sub pixels SP. The plurality of sub pixels SP which forms one pixel may share one reference line RL. For example, one reference line RL is disposed between the white sub pixel SPW and the blue sub pixel SPB to transmit the reference voltage Vref to a third transistor TR3 of each of the red sub pixel SPR, the white sub pixel SPW, the blue sub pixel SPB, and the green sub pixel SPG.

The light shielding layer LS is disposed so as to overlap the first active layer ACT1 of at least the first transistor TR1 among the plurality of transistors TR1, TR2, and TR3 to block light incident onto the first active layer ACT1. If light is irradiated onto the first active layer ACT1, a leakage current is generated so that the reliability of the first transistor TR1 which is a driving transistor may be degraded. At this time, if the light shielding layer LS configured by an opaque conductive material such as copper (Cu), aluminum (Al), molybdenum (Mo), nickel (Ni), titanium (Ti), chrome (Cr), or an alloy thereof is disposed so as to overlap the first active layer ACT1, light incident from the lower portion of the substrate 110 onto the first active layer ACT1 may be blocked or at least reduced. Accordingly, the reliability of the first transistor TR1 may be improved. However, it is not limited thereto and the light shielding layer LS may be disposed so as to overlap the second active layer ACT2 of the second transistor TR2 and the third active layer ACT3 of the third transistor TR3.

In the meantime, even though in the drawing, it is illustrated that the light single layer LS is a single layer, the light shielding layer LS may be formed as a plurality of layers. For example, the light shielding layer LS may be formed of a plurality of layers disposed so as to overlap each other with at least one of the first insulating layer 111, a second insulating layer 112, a gate insulating layer 113, and a passivation layer 114 therebetween.

The second insulating layer 112 is disposed on the plurality of high potential power lines VDD, the plurality of data lines DL, the plurality of reference lines RL, and the light shielding layer LS. The second insulating layer 112 is a layer for insulating components disposed above and below the second insulating layer 112 and may be formed of an insulating material. For example, the second insulating layer 112 may be configured by a single layer or a double layer of silicon oxide SiOx or silicon nitride SiNx, but is not limited thereto.

Referring to FIGS. 6A to 6C, in each of the plurality of sub pixels SP, the first transistor TR1, the second transistor TR2, the third transistor TR3, and the storage capacitor SC are disposed on the second insulating layer 112.

First, the first transistor TR1 includes a first active layer ACT1, a first gate electrode GE1, a first source electrode SE1, and a first drain electrode DEL The first active layer ACT1 is disposed on the second insulating layer 112. The first active layer ACT1 may be formed of a semiconductor material such as an oxide semiconductor, amorphous silicon, or polysilicon, but is not limited thereto. For example, when the first active layer ACT1 is formed of an oxide semiconductor, the first active layer ACT1 is formed by a channel region, a source region, and a drain region and the source region and the drain region may be conductive regions, but are not limited thereto.

The gate insulating layer 113 is disposed on the first active layer ACT1. The gate insulating layer 113 is a layer for electrically insulating the first gate electrode GE1 from the first active layer ACT1 and may be formed of an insulating material. For example, the gate insulating layer 113 may be configured by a single layer or a double layer of silicon oxide SiOx or silicon nitride SiNx, but is not limited thereto.

The first gate electrode GE1 is disposed on the gate insulating layer 113 so as to overlap the first active layer ACT1. The first gate electrode GE1 may be configured by a conductive material, such as copper (Cu), aluminum (Al), molybdenum (Mo), nickel (Ni), titanium (Ti), chrome (Cr), or an alloy thereof, but is not limited thereto.

A first source electrode SE1 and a first drain electrode DE1 which are spaced apart from each other are disposed on the gate insulating layer 113. The first source electrode SE1 and the first drain electrode DE1 may be electrically connected to the first active layer ACT1 through a contact hole formed on the gate insulating layer 113. The first source electrode SE1 and the first drain electrode DE1 may be disposed on the same layer as the first gate electrode GE1 to be formed of the same conductive material, but is not limited thereto. For example, the first source electrode SE1 and the first drain electrode DE1 may be configured by copper (Cu), aluminum (Al), molybdenum (Mo), nickel (Ni), titanium (Ti), chrome (Cr), or an alloy thereof, but is not limited thereto.

The first drain electrode DE1 is electrically connected to the high potential power lines VDD. For example, the first drain electrodes DE1 of the red sub pixel SPR and the white sub pixel SPW may be electrically connected to the high potential power line VDD at the left side of the red sub pixel SPR. The first drain electrodes DE1 of the blue sub pixel SPB and the green sub pixel SPG may be electrically connected to the high potential power line VDD at the right side of the green sub pixel SPR.

At this time, an auxiliary high potential power line VDDa may be further disposed to electrically connect the first drain electrode DE1 with the high potential power line VDD. One end of the auxiliary high potential power line VDDa is electrically connected to the high potential power line VDD and the other end is electrically connected to the first drain electrode DE1 of each of the plurality of sub pixels SP. For example, when the auxiliary high potential power line VDDa is formed of the same material on the same layer as the first drain electrode DE1, one end of the auxiliary high potential power line VDDa is electrically connected to the high potential power line VDD through a contact hole formed in the gate insulating layer 113 and the second insulating layer 112. The other end of the auxiliary high potential power line VDDa extends to the first drain electrode DE1 to be integrally formed with the first drain electrode DE1.

At this time, the first drain electrode DE1 of the red sub pixel SPR and the first drain electrode DE1 of the white sub pixel SPW which are electrically connected to the same high potential power lines VDD may be connected to the same auxiliary high potential power line VDDa. The first drain electrode DE1 of the blue sub pixel SPB and the first drain electrode DE1 of the green sub pixel SPG may also be connected to the same auxiliary high potential power line VDDa. However, the first drain electrode DE1 and the high potential power line VDD may be electrically connected by another method, but it is not limited thereto.

The first source electrode SE1 may be electrically connected to the light shielding layer LS through a contact hole formed on the gate insulating layer 113 and the second insulating layer 112. Further, a part of the first active layer ACT1 connected to the first source electrode SE1 may be electrically connected to the light shielding layer LS through a contact hole formed in the second insulating layer 112. If the light shielding layer LS is floated, a threshold voltage of the first transistor TR1 varies to affect the driving of the display device 100. Accordingly, the light shielding layer LS is electrically connected to the first source electrode SE1 to apply a voltage to the light shielding layer LS and it does not affect the driving of the first transistor TR1. However, in the present specification, even though it has been described that both the first active layer ACT1 and the first source electrode SE1 are in contact with the light shielding layer LS, any one of the first source electrode SE1 and the first active layer ACT1 may be in direct contact with the light shielding layer LS. However, it is not limited thereto.

In the meantime, even though in FIG. 6B, it is illustrated that the gate insulating layer 113 is formed on the entire substrate 110, the gate insulating layer 113 may be patterned so as to overlap the first gate electrode GE1, the first source electrode SE1, and the first drain electrode DE1, but is not limited thereto.

The second transistor TR2 includes a second active layer ACT2, a second gate electrode GE2, a second source electrode SE2, and a second drain electrode DE2.

The second active layer ACT2 is disposed on the second insulating layer 112. The second active layer ACT2 may be formed of a semiconductor material such as an oxide semiconductor, amorphous silicon, or polysilicon, but is not limited thereto. For example, when the second active layer ACT2 is formed of an oxide semiconductor, the second active layer ACT2 may be formed by a channel region, a source region, and a drain region and the source region and the drain region may be conductive regions, but are not limited thereto.

The second source electrode SE2 is disposed on the second insulating layer 112. The second source electrode SE2 may be integrally formed with the second active layer ACT2 to be electrically connected to each other. For example, the semiconductor material is formed on the second insulating layer 112 and a part of the semiconductor material is conducted to form the second source electrode SE2. Therefore, a part of the semiconductor material which is not conducted may become a second active layer ACT2 and a conducted part becomes a second source electrode SE2. However, the second active layer ACT2 and the second source electrode SE2 are separately formed, but it is not limited thereto.

The second source electrode SE2 is electrically connected to the first gate electrode GE1 of the first transistor TR1. The first gate electrode GE1 may be electrically connected to the second source electrode SE2 through a contact hole formed on the gate insulating layer 113. Accordingly, the first transistor TR1 may be turned on or turned off by a signal from the second transistor TR2.

The gate insulating layer 113 is disposed on the second active layer ACT2 and the second source electrode SE2 and the second drain electrode DE2 and the second gate electrode GE2 are disposed on the gate insulating layer 113.

The second gate electrode GE2 is disposed on the gate insulating layer 113 so as to overlap the second active layer ACT2. The second gate electrode GE2 may be electrically connected to the gate line GL and the second transistor TR2 may be turned on or turned off based on the gate voltage transmitted to the second gate electrode GE2. The second gate electrode GE2 may be configured by a conductive material such as copper (Cu), aluminum (Al), molybdenum (Mo), nickel (Ni), titanium (Ti), chrome (Cr), or an alloy thereof, but is not limited thereto.

In the meantime, the second gate electrode GE2 extends from the gate line GL. That is, the second gate electrode GE2 is integrally formed with the gate line GL and the second gate electrode GE2 and the gate line GL may be formed of the same material. For example, the gate line GL may be configured by copper (Cu), aluminum (Al), molybdenum (Mo), nickel (Ni), titanium (Ti), chrome (Cr), or an alloy thereof, but is not limited thereto.

The gate line GL is a wiring line which transmits the gate voltage to each of the plurality of sub pixels SP and intersects the circuit area CA of the plurality of sub pixels SP to extend in the first direction. The gate line GL extends in the first direction to intersect the plurality of high potential power lines VDD, the plurality of data lines DL, and the plurality of reference lines RL extending in the second direction.

The second drain electrode DE2 is disposed on the gate insulating layer 113. The second drain electrode DE2 is electrically connected to the second active layer ACT2 through a contact hole formed in the gate insulating layer 113 and is electrically connected to one of the plurality of data lines DL through a contact hole formed in the gate insulating layer 113 and the second insulating layer 112, simultaneously. For example, the second drain electrode DE2 of the red sub pixel SPR is electrically connected to the first data line DL1 and the second drain electrode DE2 of the white sub pixel SPW is electrically connected to the second data line DL2. For example, the second drain electrode DE2 of the blue sub pixel SPB is electrically connected to the third data line DL3 and the second drain electrode DE2 of the green sub pixel SPG is electrically connected to the fourth data line DL4. The second drain electrode DE2 may be configured by a conductive material, such as copper (Cu), aluminum (Al), molybdenum (Mo), nickel (Ni), titanium (Ti), chrome (Cr), or an alloy thereof, but is not limited thereto.

The third transistor TR3 includes a third active layer ACT3, a third gate electrode GE3, a third source electrode SE3, and a third drain electrode DE3.

The third active layer ACT3 is disposed on the second insulating layer 112. The third active layer ACT3 may be formed of a semiconductor material such as an oxide semiconductor, amorphous silicon, or polysilicon, but is not limited thereto. For example, when the third active layer ACT3 is formed of an oxide semiconductor, the third active layer ACT3 is formed by a channel region, a source region, and a drain region and the source region and the drain region may be conductive regions, but are not limited thereto.

The gate insulating layer 113 is disposed on the third active layer ACT3 and the third gate electrode GE3, the third source electrode SE3, and the third drain electrode DE3 are disposed on the gate insulating layer 113.

The third gate electrode GE3 is disposed on the gate insulating layer 113 so as to overlap the third active layer ACT3. The third gate electrode GE3 is electrically connected to the sensing line SL and the third transistor TR3 may be turned on or turned off based on the sensing voltage transmitted to the third transistor TR3. The third gate electrode GE3 may be configured by a conductive material such as copper (Cu), aluminum (Al), molybdenum (Mo), nickel (Ni), titanium (Ti), chrome (Cr), or an alloy thereof, but is not limited thereto.

In the meantime, the third gate electrode GE3 extends from the sensing line SL. That is, the third gate electrode GE3 is integrally formed with the sensing line SL and the third gate electrode GE3 and the sensing line SL may be formed of the same material. For example, the sensing line SL may be configured by copper (Cu), aluminum (Al), molybdenum (Mo), nickel (Ni), titanium (Ti), chrome (Cr), or an alloy thereof, but is not limited thereto.

The sensing line SL transmits a sensing voltage to each of the plurality of sub pixels SP and extends between the plurality of sub pixels SP in the first direction. For example, the sensing line SL extends at a boundary between the plurality of sub pixels SP in the first direction to intersect the plurality of high potential power lines VDD, the plurality of data lines DL, and the plurality of reference lines RL extending in the second direction.

The third source electrode SE3 may be electrically connected to the third active layer ACT3 through a contact hole formed on the gate insulating layer 113. The third source electrode SE3 may be configured by a conductive material such as copper (Cu), aluminum (Al), molybdenum (Mo), nickel (Ni), titanium (Ti), chrome (Cr), or an alloy thereof, but is not limited thereto.

Further, a part of the third active layer ACT3 which is in contact with the third source electrode SE3 may be electrically connected to the light shielding layer LS through a contact hole formed in the second insulating layer 112. That is, the third source electrode SE3 may be electrically connected to the light shielding layer LS with the third active layer ACT3 therebetween. Therefore, the third source electrode SE3 and the first source electrode SE1 may be electrically connected to each other through the light shielding layer LS.

The third drain electrode DE3 may be electrically connected to the third active layer ACT3 through a contact hole formed on the gate insulating layer 113. The third drain electrode DE3 may be configured by a conductive material such as copper (Cu), aluminum (Al), molybdenum (Mo), nickel (Ni), titanium (Ti), chrome (Cr), or an alloy thereof, but is not limited thereto.

The third drain electrode DE3 is electrically connected to the reference line RL. For example, the third drain electrodes DE3 of the red sub pixel SPR, the white sub pixel SPW, the blue sub pixel SPB, and the green sub pixel SPG may be electrically connected to the same reference line RL. That is, the plurality of sub pixels SP which forms one pixel may share one reference line RL.

At this time, an auxiliary reference line RLa may be disposed to connect the reference line RL extending in the second direction to the plurality of sub pixels SP which is disposed in parallel along the first direction. The auxiliary reference line RLa may be disposed on the same layer as the gate line GL, the sensing line SL, the first touch gate line TG1, and the second touch gate line TG2. The auxiliary reference line RLa extends in the first direction to electrically connect the reference line RL and the third drain electrode DE3 of each of the plurality of sub pixels SP. One end of the auxiliary reference line RLa is electrically connected to the reference line RL through a contact hole formed in the second insulating layer 112 and the gate insulating layer 112. The other end of the auxiliary reference line RLa is electrically connected to the third drain electrode DE3 of each of the plurality of sub pixels SP. For example, the auxiliary reference line RLa may be integrally formed with the third drain electrode DE3 of each of the plurality of sub pixels SP. Therefore, the reference voltage Vref from the reference line RL may be transmitted to the third drain electrode DE3 through the auxiliary reference line RLa. However, the auxiliary reference line RLa may be separately formed from the third drain electrode DE3, but is not limited thereto.

The storage capacitor SC is disposed in the circuit area of the plurality of sub pixels SP. The storage capacitor SC may store a voltage between the first gate electrode GE1 and the first source electrode SE1 of the first transistor TR1 to allow the light emitting diode ED to continuously maintain a constant state for one frame. The storage capacitor SC includes a first capacitor electrode SC1 and a second capacitor electrode SC2.

In each of the plurality of sub pixels SP, the first capacitor electrode SC1 is disposed between the first insulating layer 111 and the second insulating layer 112. The first capacitor electrode SC1 is integrally formed with the light shielding layer LS and is electrically connected to the first source electrode SE1 through the light shielding layer LS.

The second insulating layer 112 is disposed on the first capacitor electrode SC1 and the second capacitor electrode SC2 is disposed on the second insulating layer 112. The second capacitor electrode SC2 may be disposed so as to overlap the first capacitor electrode SC1. The second capacitor electrode SC2 is integrally formed with the second source electrode SE2 to be electrically connected to the second source electrode SE2 and the first gate electrode GE1. For example, the semiconductor material is formed on the second insulating layer 112 and a part of the semiconductor material is conducted to form the second source electrode SE2 and the second capacitor electrode SC2. Accordingly, a part of the semiconductor material which is not conducted functions as a second active layer ACT2 and the conducted part functions as a second source electrode SE2 and the second capacitor electrode SC2. As described above, the first gate electrode GE1 is electrically connected to the second source electrode SE2 through the contact hole formed in the gate insulating layer 113. Accordingly, the second capacitor electrode SC2 is integrally formed with the second source electrode SE2 to be electrically connected to the second source electrode SE2 and the first gate electrode GE1.

In summary, the first capacitor electrode SC1 of the storage capacitor SC is integrally formed with the light shielding layer LS to be electrically connected to the light shielding layer LS, the first source electrode SE1, and the third source electrode SE3. Accordingly, the second capacitor electrode SC2 is integrally formed with the second source electrode SE2 and the second active layer ACT2 to be electrically connected to the second source electrode SE2 and the first gate electrode GE1. Accordingly, the first capacitor electrode SC1 and the second capacitor electrode SC2 which overlap the second insulating layer 112 therebetween constantly maintain the voltage of the first gate electrode GE1 and the first source electrode SE1 of the first transistor TR1 while the light emitting diode ED emits light. By doing this, the constant state of the light emitting diode ED is maintained.

Referring to FIGS. 6A and 6C, the first charging transistor TC1 is disposed on the second insulating layer 112. The first charging transistor TC1 may be disposed in a boundary area of the plurality of sub pixels SP which is adjacent in the second direction. For example, the first charging transistor TC1 may be disposed in any one sub pixel SP in the boundary area of the plurality of sub pixels SP which is adjacent in the second direction. Specifically, one of the plurality of transistors for touching TC1, TC2, TS1, TS2 is disposed in the boundary area of plurality of sub pixels SP which is adjacent in the second direction. In the meantime, in the present disclosure, it is described that the first charging transistor TC1 is disposed in the boundary area of the red sub pixel SPR, but is not limited thereto. That is, the first charging transistor TC1 may be disposed in the boundary area of the adjacent white sub pixels SPW, the boundary area of the adjacent blue sub pixels SPB, or the boundary area of the adjacent green sub pixels SPG.

The first charging transistor TC1 includes a fourth active layer ACT4, a fourth gate electrode GE4, a fourth source electrode SE4, and a fourth drain electrode DE4.

The fourth active layer ACT4 is disposed on the second insulating layer 112. The fourth active layer ACT4 may be formed of a semiconductor material such as an oxide semiconductor, amorphous silicon, or polysilicon, but is not limited thereto. For example, when the fourth active layer ACT4 is formed of an oxide semiconductor, the fourth active layer ACT4 is formed by a channel region, a source region, and a drain region and the source region and the drain region may be conductive regions, but are not limited thereto.

The gate insulating layer 113 is disposed on the fourth active layer ACT4 and the fourth gate electrode GE4, the fourth source electrode SE4, and the fourth drain electrode DE4 are disposed on the gate insulating layer 113.

The fourth gate electrode GE4 is disposed on the gate insulating layer 113 so as to overlap the fourth active layer ACT4. The fourth gate electrode GE4 may be electrically connected to a first touch gate line TG1. Therefore, the first charging transistor TC1 is turned on or turned off based on the first touch gate signal transmitted to the fourth gate electrode GE4. The fourth gate electrode GE4 may be configured by a conductive material such as copper (Cu), aluminum (Al), molybdenum (Mo), nickel (Ni), titanium (Ti), chrome (Cr), or an alloy thereof, but is not limited thereto.

In the meantime, the fourth gate electrode GE4 may extend from the first touch gate line TG1. That is, the fourth gate electrode GE4 is integrally formed with the first touch gate line TG1 and the fourth gate electrode GE4 and the first touch gate line TG1 may be formed of the same material. For example, the first touch gate line TG1 may be configured by copper (Cu), aluminum (Al), molybdenum (Mo), nickel (Ni), titanium (Ti), chrome (Cr), or an alloy thereof, but is not limited thereto.

The first touch gate line TG1 is a wiring line which transmits the first touch gate voltage to each of the plurality of first charging transistors TC1. The first touch gate line TG1 is formed on the same layer, by the same process, of the same material as the plurality of gate lines GL and the plurality of sensing lines SL. The first touch gate line TG1 extends in the first direction while intersecting the circuit area CA of the plurality of sub pixels SP. Further, the first touch gate line TG1 may be disposed in the boundary area of the plurality of sub pixels SP. Specifically, as illustrated in FIG. 6A, the first touch gate line TG1 may extend in the first direction in the boundary area of the plurality of sub pixels SP which is adjacent in the first direction. The first touch gate line TG1 intersects the plurality of high potential power lines VDD, the plurality of data lines DL, and the plurality of reference lines RL extending in the second direction.

In the meantime, in the boundary area of the plurality of sub pixels SP, not only the first touch gate line TG1, but also the second touch gate line TG2 is disposed. The second touch gate line TG2 extends in the first direction in the boundary area of the plurality of sub pixels SP which is adjacent in the second direction. At this time, the first touch gate lines TG1 and the second touch gate lines TG2 are alternately disposed one by one in the boundary of the plurality of sub pixels SP.

The fourth source electrode SE4 may be electrically connected to the fourth active layer ACT4 through a contact hole formed on the gate insulating layer 113. The fourth source electrode SE4 may be configured by a conductive material, such as copper (Cu), aluminum (Al), molybdenum (Mo), nickel (Ni), titanium (Ti), chrome (Cr), or an alloy thereof, but is not limited thereto.

The fourth source electrode TE4 is electrically connected to the first touch electrode TE1. For example, the fourth source electrode SE4 is electrically connected to the first main electrode unit 121a of the first sub electrode 121. That is, the fourth source electrode SE4 is connected to the first main electrode unit 121a through the contact hole formed in the first insulating layer 111, the second insulating layer 112, and the gate insulating layer 113. Therefore, the first touching voltage $V^+$ which is supplied to the first charging transistor TC1 may be charged in the first touch electrode TE1 In the meantime, in the present disclosure, it has been described that the fourth source electrode SE4 is connected to the first main electrode unit 121a of the first sub electrode 121, but is not limited thereto.

The fourth drain electrode DE4 may be electrically connected to the fourth active layer ACT4 through a contact hole formed on the gate insulating layer 113. The fourth drain electrode DE4 may be configured by a conductive material, such as copper (Cu), aluminum (Al), molybdenum (Mo), nickel (Ni), titanium (Ti), chrome (Cr), or an alloy thereof, but is not limited thereto.

The fourth drain electrode DE4 is electrically connected to the reference line RL. Specifically, the fourth drain electrode DE4 is electrically connected to the auxiliary reference line RLa. Specifically, as illustrated in FIG. 6A, the fourth drain electrode DE4 extends from the third drain electrode DE3 of the red sub pixel SPR. Therefore, the fourth drain electrode DE4 may be integrally formed with the auxiliary reference line RLa and the third drain electrode DE3 of the red sub pixel SPR. Therefore, the first touching voltage V' supplied from the reference line RL may be transmitted to the fourth drain electrode DE4 through the auxiliary reference line RLa.

Even though not illustrated in FIGS. 6A to 6C, the first sensing transistor TS1 and the first charging transistor TC1 may have the same structure. That is, all the plurality of transistors for touching TC1 and TS1 connected to the first touch electrode TE1 may have the same structure. However, the first sensing transistor TS1 may be connected to the second touch gate line TG2, rather than the first touch gate line TG1. Specifically, the sixth gate electrode of the first sensing transistor TS1 is connected to the second touch gate line TG2 and the sixth drain electrode is connected to one of the plurality of first main electrode units 121a of the first sub electrode 121, and the sixth source electrode is connected to one of the plurality of reference lines RL.

The passivation layer 114 is disposed on the first transistor TR1, the second transistor TR2, the third transistor TR3, the storage capacitor SC, and the first charging transistor TC1. The passivation layer 114 is an insulating layer for protecting components below the passivation layer 114. For example, the passivation layer 114 may be configured by a single layer or a double layer of silicon oxide SiOx or silicon nitride SiNx, but is not limited thereto. Further, the passivation layer 114 may be omitted depending on the exemplary embodiment.

A plurality of color filters CF may be disposed in the emission area of each of the plurality of sub pixels SP on the passivation layer 114. As described above, the display device 100 according to the exemplary embodiment of the present disclosure is a bottom emission type in which light emitted from the light emitting diode ED is directed to the lower portion of the light emitting diode ED and the substrate 110. Therefore, the plurality of color filters CF may be disposed below the light emitting diode ED. That is, the plurality of color filters CF may be disposed between the light emitting diode ED and the plurality of touch electrodes TE1 and TE2. Light emitted from the light emitting diode ED passes through the plurality of color filters CF and is implemented as various colors of light. In the meantime, a separate color filter CF is not disposed in the white sub pixel SPW and light emitted from the light emitting diode DE is emitted as it is.

The plurality of color filters CF may include a red color filter, a blue color filter, and a green color filter. The red color filter is disposed in an emission area EA of a red sub pixel SPR of the plurality of sub pixels SP, the blue color filter is disposed in an emission area EA of the blue sub pixel SPB, and the green color filter is disposed in an emission area EA of the green sub pixel SPG.

The planarization layer 115 is disposed on the passivation layer 114 and the plurality of color filters CF. The planarization layer 115 is an insulating layer which planarizes an upper portion of the substrate 110 on which the first transistor TR1, the second transistor TR2, the third transistor TR3, the storage capacitor SC, the first charging transistor TC1, the plurality of high potential power lines VDD, the plurality of data lines DL, the plurality of reference lines RL, the plurality of gate lines GL, the plurality of sensing lines SL, and the plurality of touch gate lines TG1 and TG2 are disposed. The planarization layer 115 may be formed of an organic material, and for example, may be configured by a single layer or a double layer of polyimide or photo acryl, but is not limited thereto.

The light emitting diode ED is disposed in an emission area EA of each of the plurality of sub pixels SP. The light emitting diode ED is disposed on the planarization layer 115 in each of the plurality of sub pixels SP. The light emitting diode ED includes an anode AN, an emission layer EL, and a cathode CA.

The anode AN is disposed on the planarization layer 115 in the emission area EA. The anode AN supplies holes to the emission layer EL so that the anode may be formed of a conductive material having a high work function. For example, the anode AN may be formed of a transparent conductive material such as indium tin oxide (ITO) and indium zinc oxide (IZO), but is not limited thereto.

In the meantime, the anode AN extends toward the circuit area CA. A part of the anode AN extends toward the first source electrode SE1 of the circuit area CA from the emission area EA and is electrically connected to the first source electrode SE1 through a contact hole formed in the planarization layer 115 and the passivation layer 114. Accordingly, the anode AN of the light emitting diode ED extends to the circuit area CA to be electrically connected to the first source electrode SE1 of the first transistor TR1 and the second capacitor electrode SC2 of the storage capacitor SC.

In the emission area EA and the circuit area CA, the emission layer EL is disposed on the anode AN. The emission layer EL may be formed as one layer over the plurality of sub pixels SP. That is, the emission layers EL of the plurality of sub pixels SP are connected to each other to be integrally formed. The emission layer EL may be configured by one emission layer or may have a structure in which a plurality of emission layers which emits different color light is laminated. The emission layer EL may further include an organic layer such as a hole injection layer, a hole transport layer, an electron transport layer, and an electron injection layer.

In the emission area EA and the circuit area CA, the cathode CT is disposed on the emission layer EL. The cathode CT supplies electrons to the emission layer EL so that the cathode may be formed of a conductive material having a low work function. The cathode CT may be formed as one layer over the plurality of sub pixels SP. That is, the cathodes CT of the plurality of sub pixels SP are connected to be integrally formed. For example, the cathode CT may be formed of a transparent conductive material such as indium tin oxide (ITO) and indium zinc oxide (IZO) or ytterbium (Yb) alloy and may further include a metal doping layer, but is not limited thereto. Even though it is not illustrated in FIGS. 4 and 5, the cathode CT of the light emitting diode ED is electrically connected to the low potential power line VSS to be supplied with a low potential power voltage.

The bank 116 is disposed between the anode AN and the emission layer EL. The bank 116 is disposed to overlap the active area AA and cover the edge of the anode AN. The bank 116 is disposed at the boundary between the sub pixels SP which are adjacent to each other to reduce the mixture of light emitted from the light emitting diode ED of each of the plurality of sub pixels SP. For example, the bank 116 may be formed of an insulating material such as polyimide, acryl, or benzocyclobutene (BCB) resin, but it is not limited thereto.

Figure 7A:
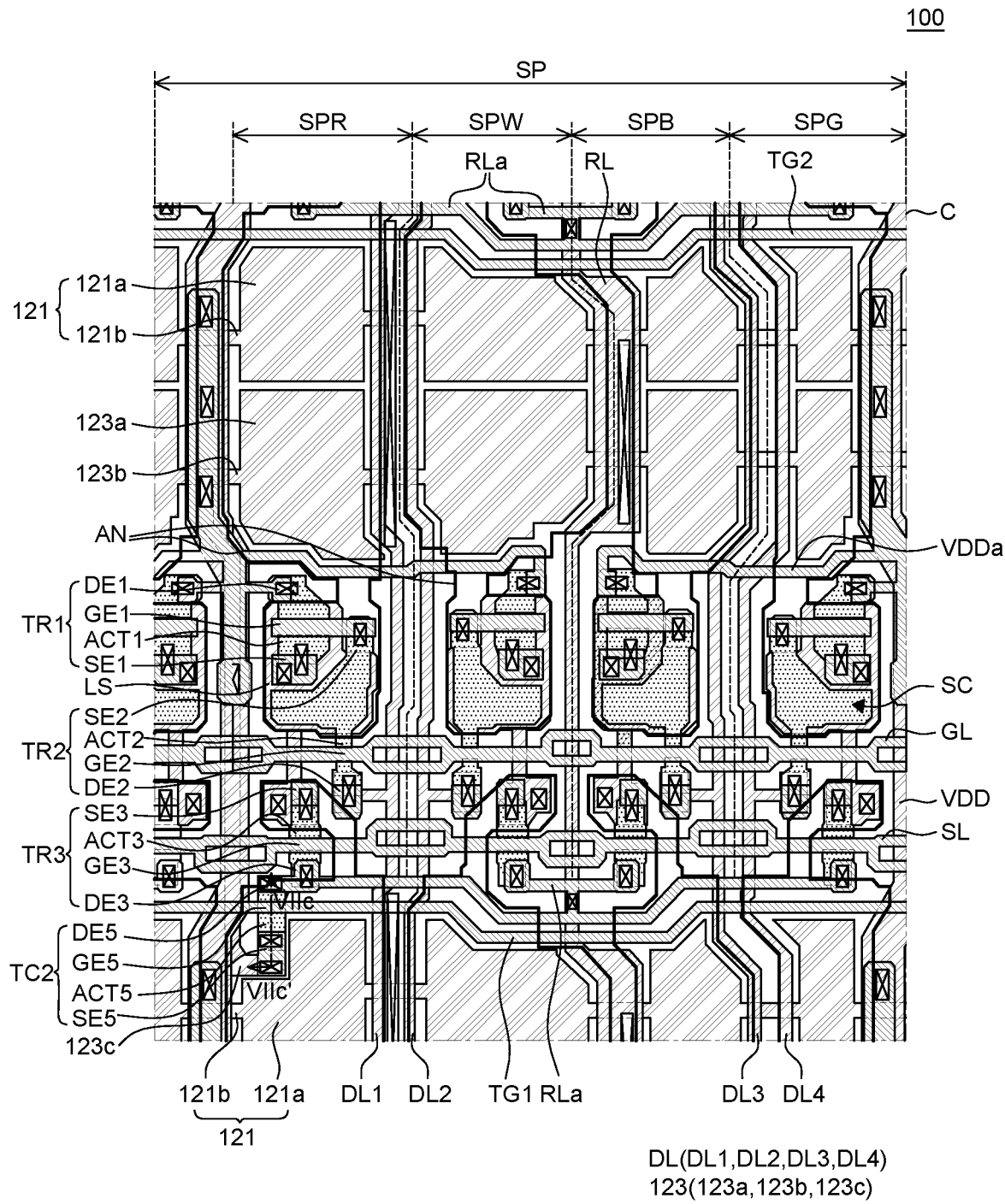
FIG. 7A is an enlarged plan view of a portion C of FIG. 4 according to an exemplary embodiment of the present disclosure.
Figure 7B:
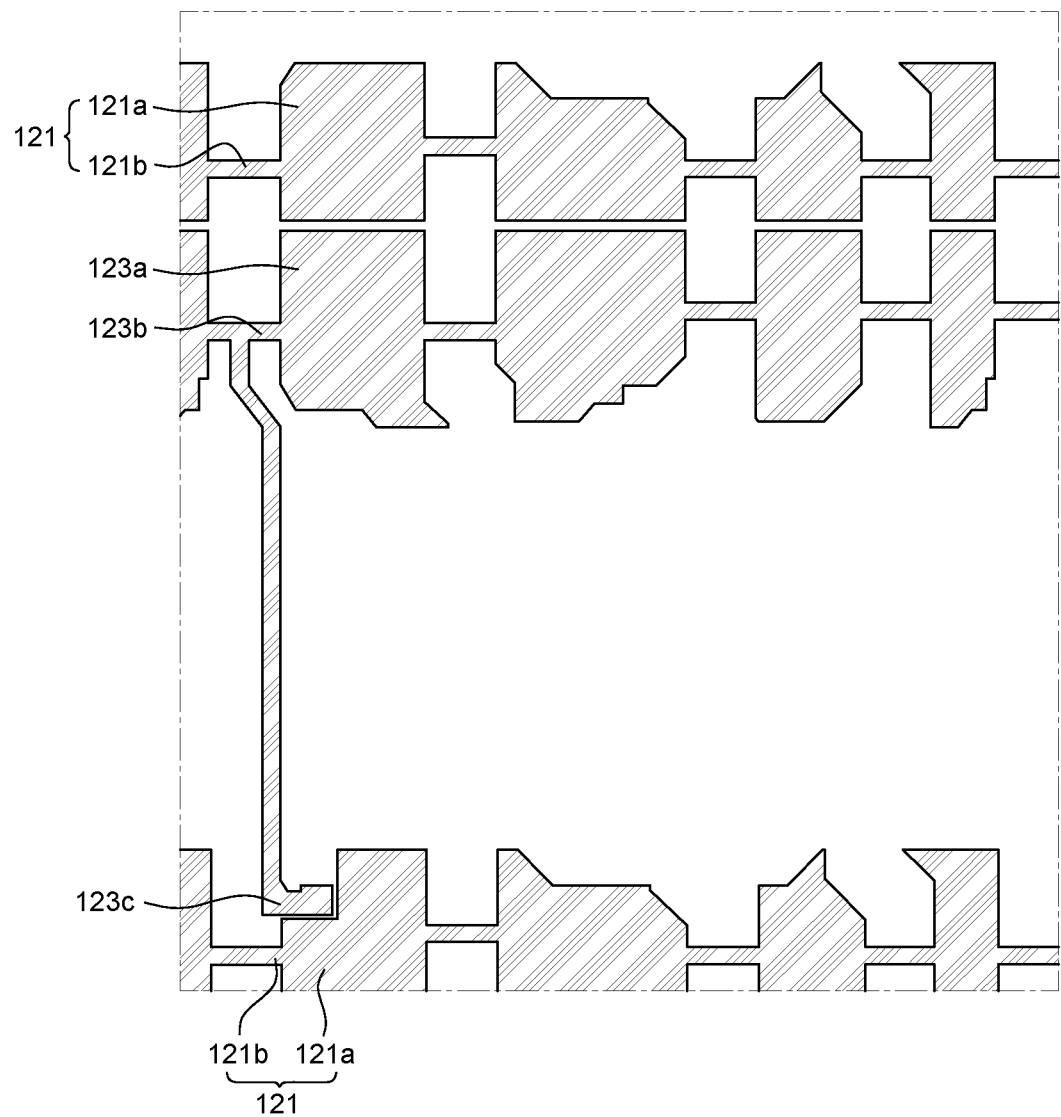
FIG. 7B illustrates only a touch electrode in FIG. 7A according to an exemplary embodiment of the present disclosure.
Figure 7C:
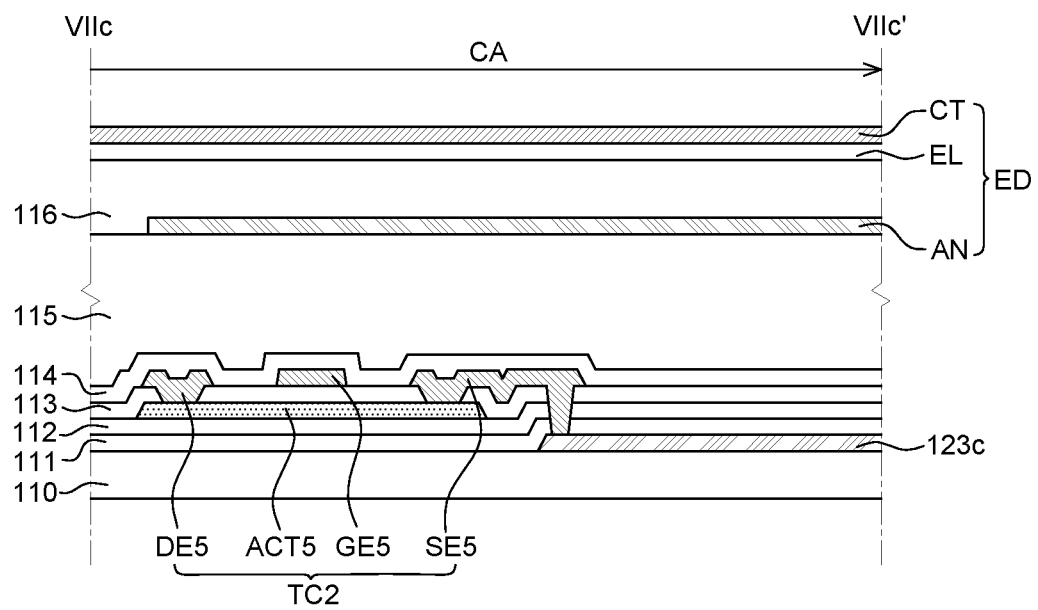
FIG. 7C is a cross-sectional view taken along VIIc-VIIc' of FIG. 7A according to an exemplary embodiment of the present disclosure.

FIG. 7A is an enlarged plan view of a portion C of FIG. 4 according to one embodiment. FIG. 7B illustrates a touch electrode in FIG. 7A according to one embodiment without the other components of the display device. FIG. 7C is a cross-sectional view taken along VIIc-VIIc' of FIG. 7A according to one embodiment. FIGS. 7A to 7C illustrate an area in which the second charging transistor TC2 is disposed. Therefore, description for the same parts as those in FIGS. 6A to 6C will be omitted.

Referring to FIGS. 7A to 7C, the second charging transistor TC2 is disposed on the second insulating layer 112. The second charging transistor TC2 may be disposed in a boundary area of the plurality of sub pixels SP which is adjacent in the second direction. For example, the second charging transistor TC2 may be disposed in any one sub pixel SP in the boundary area of the plurality of sub pixels SP which is adjacent in the second direction. In the meantime, in the present disclosure, it is described that the second charging transistor TC2 is disposed in the boundary area of the red sub pixel SPR, but is not limited thereto. That is, the second charging transistor TC2 may be disposed in the boundary area of the adjacent white sub pixels SPW, the boundary area of the adjacent blue sub pixels SPB, or the boundary area of the adjacent green sub pixels SPG.

The second charging transistor TC2 includes a fifth active layer ACT5, a fifth gate electrode GE5, a fifth source electrode SE5, and a fifth drain electrode DE5.

The fifth active layer ACT5 is disposed on the second insulating layer 112. The fifth active layer ACT5 may be formed of a semiconductor material such as an oxide semiconductor, amorphous silicon, or polysilicon, but is not limited thereto. For example, when the fifth active layer ACT5 is formed of an oxide semiconductor, the fifth active layer ACT5 is formed by a channel region, a source region, and a drain region and the source region and the drain region may be conductive regions, but are not limited thereto.

The gate insulating layer 113 is disposed on the fifth active layer ACT5 and the fifth gate electrode GE5, the fifth source electrode SE5, and the fifth drain electrode DE5 are disposed on the gate insulating layer 113.

The fifth gate electrode GE5 is disposed on the gate insulating layer 113 so as to overlap the fifth active layer ACT5. The fifth gate electrode GE5 may be electrically connected to the first touch gate line TG1. Therefore, the second charging transistor TC2 is turned on or turned off based on the first touch gate signal transmitted to the fifth gate electrode GE5. The fifth gate electrode GE5 may be configured by a conductive material, such as copper (Cu), aluminum (Al), molybdenum (Mo), nickel (Ni), titanium (Ti), chrome (Cr), or an alloy thereof, but is not limited thereto.

In the meantime, the fifth gate electrode GE5 may extend from the first touch gate line TG1. That is, the fifth gate electrode GE5 is integrally formed with the first touch gate line TG1 and the fifth gate electrode GE5 and the first touch gate line TG1 may be formed of the same material. For example, the first touch gate line TG1 may be configured by copper (Cu), aluminum (Al), molybdenum (Mo), nickel (Ni), titanium (Ti), chrome (Cr), or an alloy thereof, but is not limited thereto.

The fifth source electrode SE5 may be electrically connected to the fifth active layer ACT5 through a contact hole formed on the gate insulating layer 113. The fifth source electrode SE5 may be configured by a conductive material such as copper (Cu), aluminum (Al), molybdenum (Mo), nickel (Ni), titanium (Ti), chrome (Cr), or an alloy thereof, but is not limited thereto.

The fifth source electrode SE5 is electrically connected to the second touch electrode TE2. For example, the fifth source electrode SE5 is electrically connected to the extension unit 123c of the second sub electrode 123. Here, the extension unit 123c may be an area extending from the second connection unit 123b of the second sub electrode 123. Specifically, as illustrated in FIGS. 7A and 7B, the second connection unit 123b is formed at the left side from the second main electrode unit 123a disposed in the red sub pixel SPR and the extension unit 123c is formed downwardly from the second connection unit 123b. The extension unit 123c extends from the second connection unit 123b to the boundary portion of the adjacent red sub pixel SPR in the second direction. The extension unit 123c is electrically connected to the fifth source electrode SE5 through the contact hole formed in the first insulating layer 111, the second insulating layer 112, and the gate insulating layer 113. That is, one end of the extension unit 123c is integrally formed with the second connection unit 123b and the other end is connected to the fifth source electrode SE5. Therefore, the second touching voltage V⁻ which is supplied to the second charging transistor TC2 may be charged in the second touch electrode TE2. In the meantime, in the present disclosure, it has been described that the fifth source electrode SE5 is connected to the extension unit 123c of the second sub electrode 123, but is not limited thereto.

The fifth drain electrode DE5 may be electrically connected to the fifth active layer ACT5 through a contact hole formed on the gate insulating layer 113. The fifth drain electrode DE5 may be configured by a conductive material such as copper (Cu), aluminum (Al), molybdenum (Mo), nickel (Ni), titanium (Ti), chrome (Cr), or an alloy thereof, but is not limited thereto.

The fifth drain electrode DE5 is electrically connected to the reference line RL. Specifically, the fifth drain electrode DE5 is electrically connected to the auxiliary reference line RLa. Specifically, as illustrated in FIG. 7A, the fifth drain electrode DE5 extends from the third drain electrode DE3 of the red sub pixel SPR. Therefore, the fifth drain electrode DE5 may be integrally formed with the auxiliary reference line RLa and the third drain electrode DE3 of the red sub pixel SPR. Here, the reference line RL connected to the fifth drain electrode DE5 of the second charging transistor TC2 may be different from the reference line RL connected to the fourth drain electrode DE4 of the first charging transistor TC1. Therefore, the second touching voltage V⁻ supplied from the reference line RL may be transmitted to the fifth drain electrode DE5 through the auxiliary reference line RLa.

Even though not illustrated in FIGS. 7A to 7C, the second sensing transistor TS2 and the second charging transistor TC2 may have the same structure. That is, all the plurality of transistors TC2 and TS2 for sensing touching and are connected to the second touch electrode TE2 may have the same structure. However, the second sensing transistor TS2 may be connected to the second touch gate line TG2, rather than the first touch gate line TG1. Specifically, a seventh gate electrode of the second sensing transistor TS2 is connected to the second touch gate line TG2 and a seventh drain electrode is connected to one of the extension units 123c of the second sub electrode 123, and a seventh source electrode is connected to one of the plurality of reference lines RL.

Figure 8:
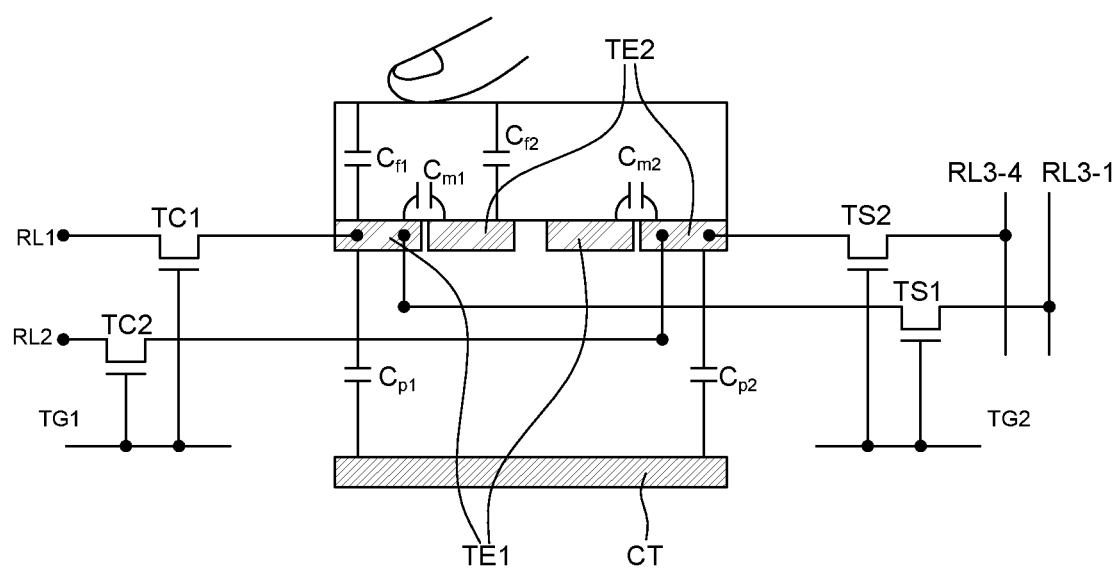
FIG. 8 is a view for explaining a touch sensing method of a display device according to an exemplary embodiment of the present disclosure.

FIG. 8 is a view for explaining a touch sensing method of a display device according to an exemplary embodiment of the present disclosure.

Referring to FIG. 8, when a touch is subjected to a specific touch electrode block of the display device 100, various capacitances $C_{f1}$, $C_{f2}$, $C_{m1}$, $C_{m2}$, $C_{p1}$, $C_{p2}$ are generated between the finger, the first touch electrode TE1, the second touch electrode TE2, and the cathode CT. Here, $C_{f1}$ is a capacitance between the finger and the first touch electrode TE1, $C_{f2}$ is a capacitance between the finger and the second touch electrode TE2, and $C_{m1}$ is a capacitance between the first touch electrode TE1 corresponding to the finger and the second touch electrode TE2. Further, $C_{m2}$ is a capacitance between the first touch electrode TE1 and the second touch electrode TE2 adjacent to the first touch electrode TE1 and the second touch electrode TE2 corresponding to the finger. $C_{p1}$ is a parasitic capacitance between the plurality of first touch electrodes TE1 and the cathode CT and $C_{p1}$ is a parasitic capacitance between the plurality of second touch electrodes TE2 and the cathode CT. Here, even though it is illustrated that $C_{p1}$ and $C_{p2}$ are parasitic capacitances between the touch electrodes TE1 and TE2 and the cathode CT, $C_{p1}$ and $C_{p2}$ may refer to a total of parasitic capacitances between other electrodes or wiring lines disposed between the touch electrodes TE1 and TE2 and the cathode CT and the touch electrodes TE1 and TE2. In FIG. 8, for the convenience of description, only the cathode CT is illustrated as a component which generates the parasitic capacitance.

When the user touches the display device with a finger, a quantity of electric charges formed in the first touch electrode TE1 corresponding to the finger and a quantity of electric charges formed in the second touch electrode TE2 may be represented as follows.

$$Q(TE1)=C_{f1}V^++C_{m1}(V^+-V^-)+C_{p1}V^+ \quad \text{[Equation 1]}$$

$$Q(TE2)=C_{m2}(V^--V^+)+C_{p2}V^- \quad \text{[Equation 2]}$$

Here, $V^+$ and $V^-$ denote a first touching voltage $V^+$ charged in the first touch electrode TE1 through the first reference line RL1 and a second touching voltage $V^-$ charged in the second touch electrode TE2 through the second reference line RL2, respectively.

Further, a total quantity of sensed electric charges which is a sum Q(TE1)+Q(TE2) of a quantity of electric charges sensed by the third reference lines RL3-1 and RL3-4 may be represented as follows.

$$Q(RO)=C_{f1}V^++C_{p1}V^++C_{p2}V^-+(C_{m1}-C_{m2})(V^+-V^-) \quad \text{[Equation 3]}$$

Here, for the Equation approximation, if the first touching voltage $V^+$ and the second touching voltage $V^-$ are set to be equal and the display device 100 is designed to have a relationship of "$C_{p1}=C_{p2}$", a total quantity of sensed electric charges which is finally sensed is as follows.

$$Q(RO)=(C_{f1}+2\Delta C_m)V^+(\because C_{m1}=C_m+\Delta C_m, C_{m2}=C_m) \quad \text{[Equation 4]}$$

As a result, in Equation 3, the influence by the parasitic capacitance may be removed. Accordingly, only the capacitance formed in the touch electrodes TE1 and TE2 is sensed regardless of the magnitude of the parasitic capacitance.

Generally, a touch technique used for the display device uses an add-on film manner or a touch on Encap manner in which the touch structure is formed on an encapsulation unit. In the case of the add-on film manner, the touch panel is formed above the film so that a separate cost of materials and processing costs are caused. Further, the touch pattern is formed on the film so that the transmittance and the resolution of the display device are degraded. In the case of the TOE manner, there are disadvantages in that in order to form the touch electrode, at least four sheets of photo masks are necessary and separate equipment for producing the mask is necessary.

The display device 100 according to the exemplary embodiment of the present disclosure may be an in-cell touch type display device 100. That is, a structure for implementing the touch is not separately formed, but may be formed together with the other components by a continuous process in the display device 100.

Specifically, the touch electrodes TE1 and TE2 are formed of a transparent conductive material to be disposed between the substrate 110 and the light emitting diode ED. Therefore, light emitted from the light emitting diode ED may pass through the transparent touch electrodes TE1 and TE2 to be easily emitted. The plurality of transistors for touching TC1, TC2, TS1, and TS2 electrically connected to the plurality of touch electrodes TE1 and TE2 may be simultaneously formed with the plurality of transistors TR1, TR2, TR3 in the sub pixel SP, by the same process. A plurality of touch gate lines TG1 and TG2 for driving the plurality of touch electrodes TE1 and TE2 may be simultaneously formed with the plurality of gate lines GL and the plurality of sensing lines SL by the same process. The plurality of touch electrodes TE1 and TE2 exchanges signals for touching through a reference line RL which transmits the reference voltage Vref to the plurality of sub pixels SP.

Therefore, the display device 100 according to the exemplary embodiment of the present disclosure implements the display device 100 with an in-cell touch structure by adding only the mask for forming the touch electrodes TE1 and TE2. Accordingly, there is an advantage in that the touch structure may be implemented by the simple process with a minimum cost.

Further, in the display device 100 according to the exemplary embodiment of the present disclosure, only the quantity of electric charges formed in the touch electrodes TE1 and TE2 can be sensed regardless of the magnitude of the quantity of electric charges generated by the parasitic capacitance. Therefore, the accuracy of touch sensing may be improved. Further, in order to reduce the parasitic capacitance, it is not necessary to dispose the planarization layer between the touch electrodes TE1 and TE2 and the other components so that the process may be simplified and the cost may be saved.

Further, in the display device 100 according to the exemplary embodiment of the present disclosure, the parasitic capacitance by the touch electrodes TE1 and TE2 can be ignored and the average voltage applied to the touch electrodes TE1 and TE2 may be constantly maintained. Therefore, the influence on the anode AN disposed above the touch electrodes TE1 and TE1 may be reduced. That is, even though the touch electrodes TE1 and TE2 are below the anode AN, it does not influence a current flowing through the anode AN. Accordingly, even though the display device 100 according to the exemplary embodiment of the present disclosure is implemented as the in-cell touch structure, a display characteristic of the display device 100 may be constantly maintained.

Figure 9:
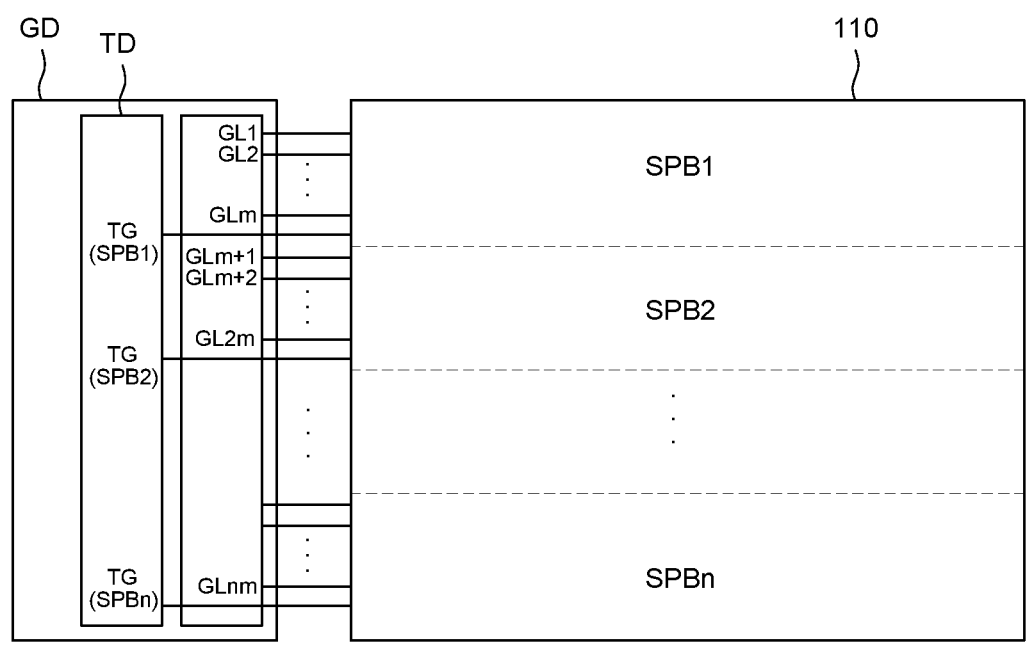
FIG. 9 is a diagram for explaining a driving method of a display device according to another exemplary embodiment of the present disclosure.
Figure 10:
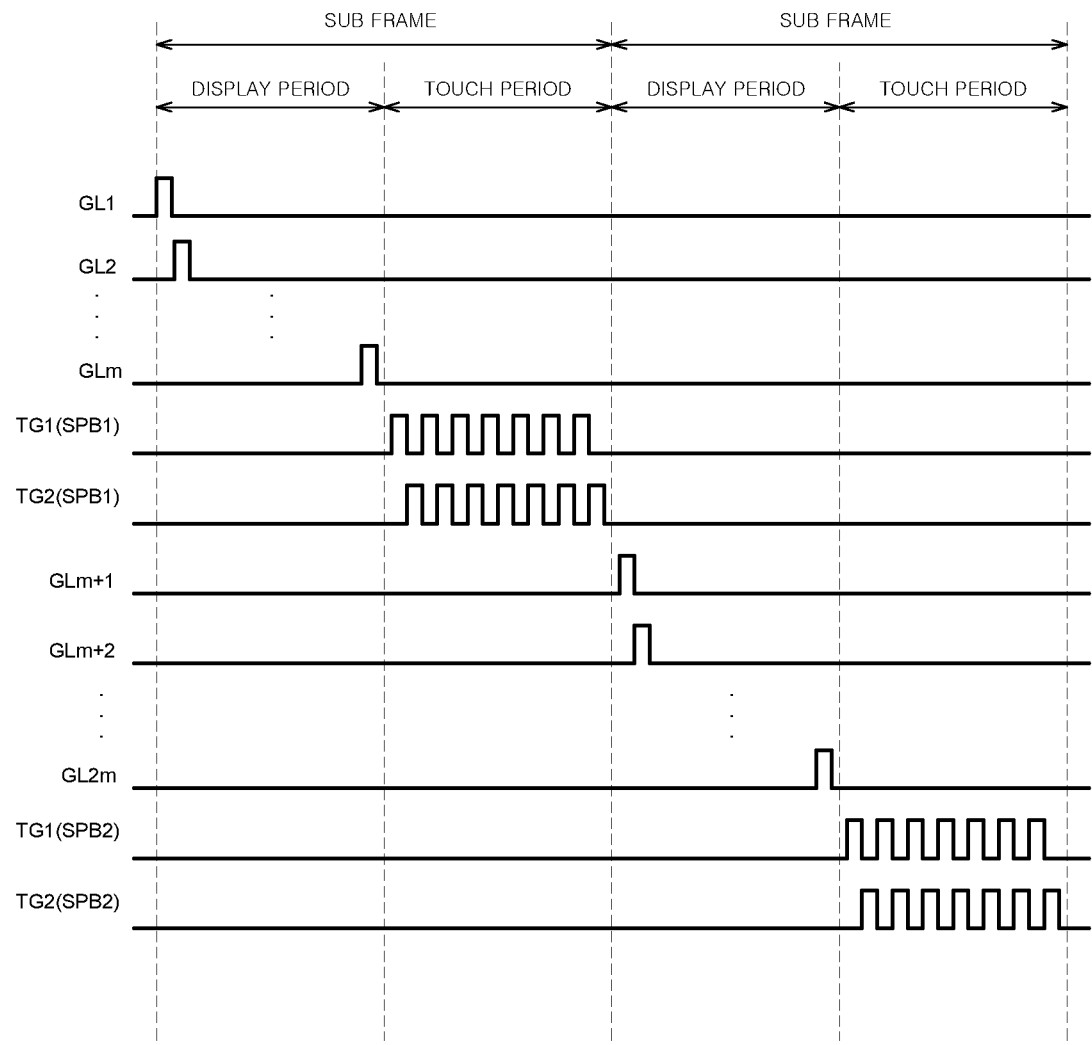
FIGS. 10 to 12B are timing diagrams illustrating a schematic operation timing for explaining a driving method of a display device according to various exemplary embodiments of the present disclosure.

FIG. 9 is a diagram for explaining a driving method of a display device according to another exemplary embodiment of the present disclosure. FIG. 10 illustrates a schematic operation timing for explaining a driving method of a display device according to another exemplary embodiment of the present disclosure. In FIG. 9, for the convenience of description, among various components of the display device, only a substrate 110, a gate driver GD, and a touch driver TD are illustrated. In FIG. 10, for the convenience of description, signals of gate lines GL1, GL2, . . . , GLm, GLm+1, GLm+2, . . . GL2m and touch gate lines TG1 (SPB1), TG2(SPB1), TG1(SPB2), TG2(SPB2) are schematically illustrated.

First, referring to FIG. 9, the display device according to another exemplary embodiment of the present disclosure includes the substrate 110, the gate driver GD, and the touch driver TD.

The substrate 110 includes a plurality of sub pixel blocks SPB. Each of the plurality of sub pixel blocks SPB includes some of the plurality of sub pixels SP. That is, the plurality of sub pixels SP is divided into a plurality of sub pixel blocks SPB. For example, the plurality of sub pixel blocks SPB may be individual areas obtained by dividing the substrate 110 by a virtual line in the first direction. Each of the plurality of sub pixel blocks SPB includes the same number of sub pixels SP. The substrate 110 includes a total of n sub pixel blocks SPB1, SPB2, . . . , SPBn. Specifically, a second sub pixel block SPB2 is disposed below the first sub pixel block SPB1 and a third sub pixel block is disposed below the second sub pixel block and in this manner, a total of n sub pixel blocks SPB1, SPB2, . . . , SPBn may be included from an upper portion to a lower portion on the substrate 110.

Each of the plurality of sub pixel blocks SPB includes the plurality of touch electrodes TE1 and TE2. Specifically, the plurality of touch electrodes TE1 and TE2 may be disposed so as to correspond to each of the plurality of sub pixels SP. Each of the plurality of sub pixel blocks SPB includes the plurality of touch electrodes TE1 and TE2 overlapping the corresponding sub pixel SP.

The gate driver GD may be electrically connected to the plurality of sub pixels SP of the substrate 110 through the plurality of gate lines GL. Each of the plurality of gate lines GL may be electrically connected to the plurality of sub pixels SP arranged in the first direction. One sub pixel block SPB may correspond to a total of m gate lines GL1, GL2, . . . , GLm, GLm+1, GLm+2, GL2m, . . . , GLnm. For example, the first sub pixel block SPB1 is electrically connected to a first gate line GL1, a second gate line GL2, . . . , an m-th gate line GLm. The second sub pixel block SPB2 may be electrically connected to a m+1-th gate line GLm+1, a m+2-th gate line GLm+2, . . . , and a 2m-th gate line GL2m.

The gate driver GD sequentially supplies a gate line to the plurality of gate lines GL in response to the gate control signal supplied from the timing controller. Therefore, the plurality of second transistors TR2 electrically connected to the plurality of gate lines GL may be sequentially driven. The gate driver GD includes a plurality of gate integrated circuits. Each of the plurality of gate integrated circuits includes a shift register, a level shifter, and an output buffer. The shift register sequentially generates a gate pulse. The level shifter shifts a swing width of the gate pulse to a predetermined level to generate a gate signal. The output buffer supplies a gate signal supplied from the level shifter to the gate line GL.

The gate driver GD is attached to the non-active area NA of the substrate as a chip or is mounted in the non-active area NA of the substrate 110 in the gate-in-panel manner. Further, even though it is not illustrated, the timing controller to supply the gate control signal to the gate driver GD may be disposed on the printed circuit board 170, but the present disclosure is not limited thereto.

The touch driver TD may be disposed in the gate driver GD. The touch driver TD may be electrically connected to the plurality of touch electrodes TE1 and TE2 of the substrate 110 through the plurality of touch gate lines TG. In the meantime, TG(SPB1), TG(SPB2), . . . , TG(SPBn) of FIG. 9 refer to all touch gate lines TG connected to the plurality of touch electrodes TE1 and TE2 of the corresponding sub pixel block SPB. For example, the plurality of touch electrodes TE1 and TE2 disposed in the first sub pixel block SPB1 may be electrically connected to the touch gate line TG(SPB1). The plurality of touch electrodes TE1 and TE2 disposed in the second sub pixel block SPB2 may be electrically connected to the touch gate line TG(SPB2). The plurality of touch electrodes TE1 and TE2 disposed in the n-th sub pixel block SPBn may be electrically connected to the touch gate line TG(SPBn).

In the meantime, even though in FIG. 9, for the convenience of description, it is illustrated that one sub pixel block SPB and one touch gate line TG correspond to each other, it is not limited thereto. That is, a plurality of touch gate lines TG extending from the touch driver TD to each of the plurality of sub pixel blocks SPB may be configured.

The touch driver TD sequentially supplies a touch gate signal to the plurality of touch gate lines TG in response to the PWM signal. Accordingly, the plurality of transistors for touching TC1, TC2, TS1, TS2 electrically connected to each of the plurality of touch gate lines TG is sequentially driven. Here, a PWM signal is supplied by the timing controller, but is not limited thereto. The touch driver TD includes a plurality of touch integrated circuits. Each of the plurality of touch integrated circuits includes a shift register, a level shifter, an output buffer, and an inverter. The shift register sequentially generates a touch gate pulse. The level shifter shifts a swing width of the touch gate pulse to a predetermined level to generate a touch gate signal. The output buffer supplies a touch gate signal supplied from the level shifter to the touch gate line TG. The inverter inverts the generated touch gate signal to generate an inverted touch gate signal.

In the meantime, the plurality of touch gate lines TG may include a first touch gate line TG1 and a second touch gate line TG2. The first touch gate line TG1 may be a wiring line connected to a plurality of charging transistors TC1 and TC2. The second touch gate line TG2 may be a wiring line connected to a plurality of sensing transistors TS1 and TS2. Further, the touch gate signal includes a first touch gate signal and a second touch gate signal. That is, the first touch gate line TG1 supplies a first touch gate signal and the second touch gate line TG2 supplies a second touch gate signal. In one touch period, the first touch gate signal and the second touch gate signal may be inverted signals from each other. Specifically, each of the plurality of touch integrated circuits generates a first touch gate signal first to output the first touch gate signal to the first touch gate line TG1. Further, the second gate signal which is inverted from the first touch gate signal is generated using the inverter and output to the second touch gate line TG2.

In the meantime, even though in FIG. 9, the touch driver TD is disposed in the gate driver GD, it is not limited thereto. For example, the touch driver TD may be disposed in the printed circuit board 170.

Referring to FIG. 10, one frame of the display device may include a plurality of sub frames. Here, the plurality of sub frames may correspond to each of the plurality of sub pixel blocks SPB. That is, the first sub frame is a period for driving the first sub pixel block SPB1, the second sub frame is a period for driving the second sub pixel block SPB2, and the n-th sub frame is a period for driving the n-th sub pixel block SPBn. Each of the plurality of sub frames may be time-divisionally driven in the display period and the touch period.

First, in the display period of the first sub frame, the gate signal is applied to the plurality of gate lines GL corresponding to the first sub pixel block SPB1. At this time, the first sub pixel block SPB1 corresponds to the first gate line GL1, the second gate line GL2, . . . , and the m-th gate line GLm. Therefore, the gate signal may be sequentially applied to the first gate line GL1, the second gate line GL2, . . . , and the m-th gate line GLm. Therefore, the plurality of second transistors TR2 which is connected to the first gate line GL1, the second gate line GL2, . . . , and the m-th gate line GLm may be sequentially turned on.

After the display period of the first sub frame, a touch period of the first sub frame may be proceeded. Specifically, the first touch gate signal may be applied to the plurality of first touch gate lines TG1(SPB1) corresponding to the first sub pixel block SPB1. Therefore, the plurality of first charging transistors TC1 and the plurality of second charging transistors TC2 connected to the plurality of first touch gate lines TG1(SPB1) are turned on. Further, the second touch gate signal may be applied to the plurality of second touch gate lines TG2(SPB2) corresponding to the first sub pixel block SPB1. Therefore, the plurality of first sensing transistors TS1 and the plurality of second sensing transistors TS2 connected to the plurality of second touch gate lines TG2(SPB2) are turned on.

At this time, in the touch period, the first touch gate signal and the second touch gate signal may be inverted signals from each other. That is, when the first touch gate signal is a high level, the second touch gate signal is a low level and when the first touch gate signal is a low level, the second touch gate signal may be a high level. Therefore, when the plurality of first charging transistors TC1 and the plurality of second charging transistors TC2 are turned on, the plurality of first sensing transistors TS1 and the plurality of second sensing transistors TS2 may be turned off. Accordingly, the first touching voltage V⁺ and the second touching voltage V⁻ may be charged in the plurality of first touch electrodes TE1 and the plurality of second touch electrodes TE2 of the first sub pixel block SPB1, respectively. Further, when the plurality of first charging transistors TC1 and the plurality of second charging transistors TC2 are turned off, the plurality of first sensing transistors TS1 and the plurality of second sensing transistors TS2 may be turned on. Accordingly, the touch sensing signal may be transmitted from each of the plurality of first touch electrodes TE1 and the plurality of second touch electrodes TE2 of the first sub pixel block SPB1.

After the touch period of the first sub frame ends, a display period of the second sub frame may be proceeded. That is, the driving for the second sub pixel block SPB2 disposed below the first sub pixel block SPB1 of the substrate 110 may be proceeded.

Specifically, in the display period of the second sub frame, the gate signal is sequentially applied to the plurality of gate lines GLm+1, GLm+2, . . . , GL2m corresponding to the second sub pixel block SPB2. Next, in the touch period of the second sub frame, the first touch gate signal and the second touch gate signal may be applied to the plurality of first touch gate lines TG1(SPB2) and the plurality of second touch gate lines TG2(SPB2) corresponding to the second sub pixel block SPB2. This operation may be sequentially performed to the n-th sub pixel block SPBn. Such one frame is repeated so that the display device may be driven.

In the meantime, even though in FIG. 10, each of the first touch gate signal and the second touch gate signal has seven peaks, the present disclosure is not limited thereto.

A display device according to another exemplary embodiment of the present disclosure may be an in-cell touch type display device. Specifically, a frame of the display device may be configured by a plurality of sub frames having a display period and a touch period. Therefore, the driving for the plurality of sub pixels SP and the sensing for the touch electrodes TE1 and TE2 may be easily performed in the display device.

Figure 11:
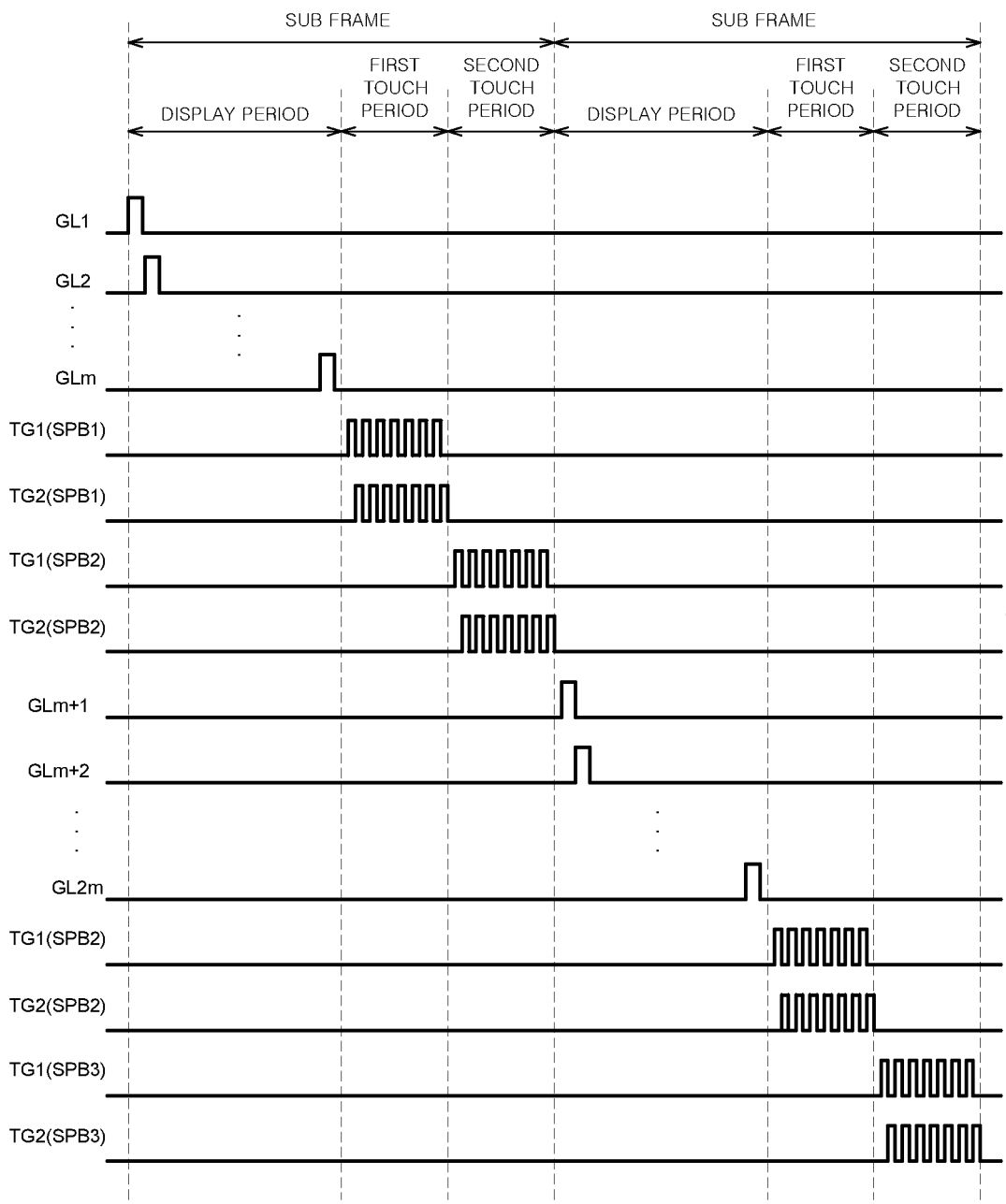

FIG. 11 illustrates a schematic operation timing for explaining a driving method of a display device still according to another exemplary embodiment of the present disclosure. In FIG. 11, for the convenience of description, signals of gate lines GL1, GL2, . . . GLm, GLm+1, GLm+2, . . . , GL2m and touch gate lines TG1(SPB1), TG2(SPB1), TG1(SPB2), TG2(SPB2) are schematically illustrated.

Referring to FIG. 11, one frame of the display device may include a plurality of sub frames. Here, the plurality of sub frames may be periods which sequentially display the plurality of sub pixel blocks SPB. That is, the first sub frame is a period for driving the plurality of sub pixels SP of the first sub pixel block SPB1, the second sub frame is a period for driving the plurality of sub pixels SP of the second sub pixel block SPB2, and the n-th sub frame is a period for driving the plurality of sub pixels SP of the n-th sub pixel block SPBn. Each of the plurality of sub frames may be time-divisionally driven in the first touch period and the second touch period. At this time, the first touch period and the second touch period may be formed for different sub pixel blocks SPB among the plurality of sub pixel blocks SPB.

First, in the display period of the first sub frame, the gate signal is sequentially applied to the plurality of gate lines GL1, GL2, . . . , GLm corresponding to the first sub pixel block SPB1.

After the display period of the first sub frame, a first touch period of the first sub frame may be proceeded. Specifically, the first touch gate signal and the second touch gate signal may be applied to each of the plurality of first touch gate lines TG1(SPB1) and the plurality of second touch gate lines TG2(SPB1) corresponding to the first sub pixel block SPB1.

After the first touch period of the first sub frame, a second touch period of the first sub frame may be proceeded. Specifically, the first touch gate signal and the second touch gate signal may be applied to each of the plurality of first touch gate lines TG1(SPB2) and the plurality of second touch gate lines TG2(SPB2) corresponding to the second sub pixel block SPB2.

After the second touch period of the first sub frame ends, a display period of the second sub frame may be proceeded. That is, the driving for the second sub pixel block SPB2 disposed below the first sub pixel block SPB1 of the substrate 110 may be proceeded.

Specifically, in the display period of the second sub frame, the gate signal is sequentially applied to the plurality of gate lines GLm+1, GLm+2, . . . , GL2m corresponding to the second sub pixel block SPB2. Next, in the first touch period of the second sub frame, the first touch gate signal and the second touch gate signal may be applied to each of the plurality of first touch gate lines TG1(SPB2) and the plurality of second touch gate lines TG2(SPB2) corresponding to the second sub pixel block SPB2. Next, in the second touch period of the second sub frame, the first touch gate signal and the second touch gate signal may be applied to each of the plurality of first touch gate lines TG1(SPB3) and the plurality of second touch gate lines TG2(SPB3) corresponding to the third sub pixel block SPB3.

This operation may be sequentially performed to the n-th sub pixel block SPBn. Such one frame is repeated so that the display device may be driven.

In the meantime, even though in FIG. 11, it is described that the display period and the first touch period of one sub frame are formed for the same sub pixel block SPB, the present disclosure is not limited thereto. Further, even though in FIG. 11, it is described that the first touch period and the second touch period of one sub frame are sequentially formed for the adjacent sub pixel block SPB, the present disclosure is not limited thereto. That is, the first touch period and the second touch period of one sub frame may be formed for different arbitrary sub pixel blocks SPB among the plurality of sub pixel blocks SPB.

In the display device according to still another exemplary embodiment of the present disclosure, one frame is divided into a plurality of sub frames and each of the plurality of sub frames includes a first touch period and a second touch period. At this time, the first touch period and the second touch period may be formed for different sub pixel blocks SPB. That is, in one sub frame, the touch sensing may be performed for two different sub pixel blocks SPB. Therefore, the accuracy of touch sensing may be improved.

Figure 12A:
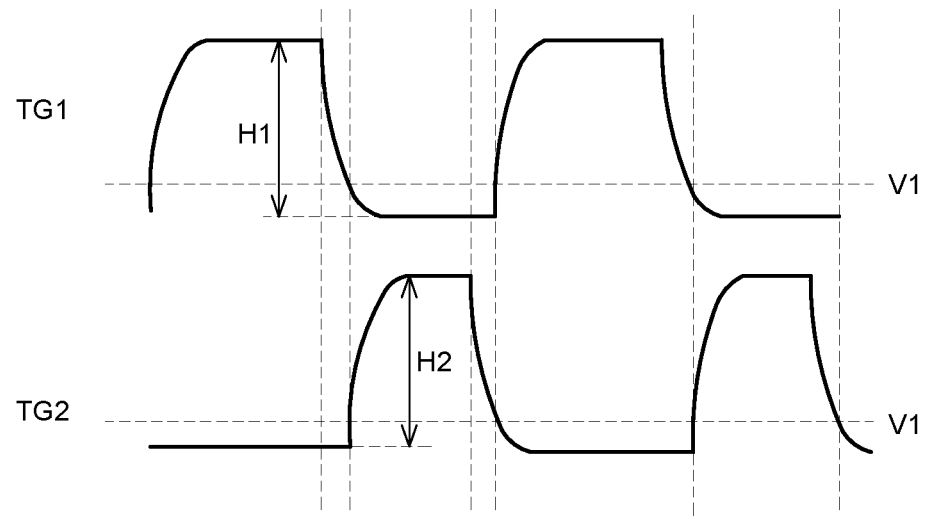

FIG. 12A illustrates a schematic operation timing for explaining a driving method of a display device still according to another exemplary embodiment of the present disclosure. In FIG. 12A, for the convenience of description, signals of the first touch gate line TG1 and the second touch gate line TG2 are schematically illustrated.

Referring to FIG. 12A, the first touch gate signal and the second touch gate signal may be applied to the first touch gate line TG1 and the second touch gate line TG2 of the display device according to another exemplary embodiment of the present disclosure, respectively. When the first touch gate signal is a high level, the plurality of first charging transistors TC1 and the plurality of second charging transistors TC2 connected to the first touch gate line TG1 may be turned on. When the second touch gate signal is a high level, the plurality of first sensing transistors TS1 and the plurality of second sensing transistors TS2 connected to the second touch gate line TG2 may be turned on. At this time, the first touch gate signal and the second touch gate signal may be inverted signals from each other in the same touch period. Further, a period in which the first touch gate signal is a high level and a period in which the second touch gate signal is a high level do not overlap. Further, heights H1 and H2 of peaks of the first touch gate signal and the second touch gate signal may be equal to each other.

Specifically, when the level of the first touch gate signal is reduced to be a first voltage (V1) or lower, a level of the second touch gate signal may be increased from the low level to the high level. That is, when the level of the first touch gate signal is higher than the first voltage (V1), the second touch gate signal may be the low level. Therefore, when the plurality of charging transistors TC1 and TC2 is turned on, the plurality of sensing transistors TS1 and TS2 may be turned off. At a timing when the level of the first touch gate signal is reduced below the first voltage (V1), a level of the second touch gate signal may be increased from the low level. When the second gate signal is completely the high level, the first touch gate signal may be the low level. Therefore, when the plurality of sensing transistors TS1 and TS2 is turned on, the plurality of charging transistors TC1 and TC2 may be turned off. Here, the first voltage V1 may be a voltage higher than the low level voltage between the low level voltage and the high level voltage. For example, the first voltage V1 may refer to a voltage corresponding to a threshold voltage of the plurality of charging transistors TC1 and TC2.

Further, when the level of the second touch gate signal is reduced to be the first voltage (V1) or lower, a level of the first touch gate signal may be increased from the low level to the high level. That is, when the level of the second touch gate signal is higher than the first voltage (V1), the first touch gate signal may be the low level. Therefore, when the plurality of sensing transistors TS1 and TS2 is turned on, the plurality of charging transistors TC1 and TC2 may be turned off. At a timing when the level of the second touch gate signal is reduced below the first voltage (V1), a level of the first touch gate signal may be increased from the low level. When the first gate signal is completely the high level, the second touch gate signal may be the low level. Therefore, when the plurality of charging transistors TC1 and TC2 is turned on, the plurality of sensing transistors TS1 and TS2 may be turned off. Here, the first voltage V1 may be a voltage higher than the low level voltage between the low level voltage and the high level voltage. For example, the first voltage V1 may refer to a voltage corresponding to a threshold voltage of the plurality of sensing transistors TS1 and In the display device according to still another exemplary embodiment of the present disclosure, when the level of the first touch gate signal is reduced to be the first voltage or lower, a level of the second touch gate signal may be increased from the low level to the high level. Further, when the level of the second touch gate signal is reduced to be the first voltage or lower, a level of the first touch gate signal may be increased from the low level to the high level. Specifically, the first voltage may refer to a threshold voltage of the plurality of charging transistors TC1 and TC2 and the plurality of sensing transistors TS1 and TS2. Therefore, the plurality of charging transistors TC1 and TC2 connected to the first touch gate line TG1 and the plurality of sensing transistors TS1 and TS2 connected to the second touch gate line TG2 are suppressed to be simultaneously turned on. Therefore, the accuracy of touch sensing may be improved.

Figure 12B:
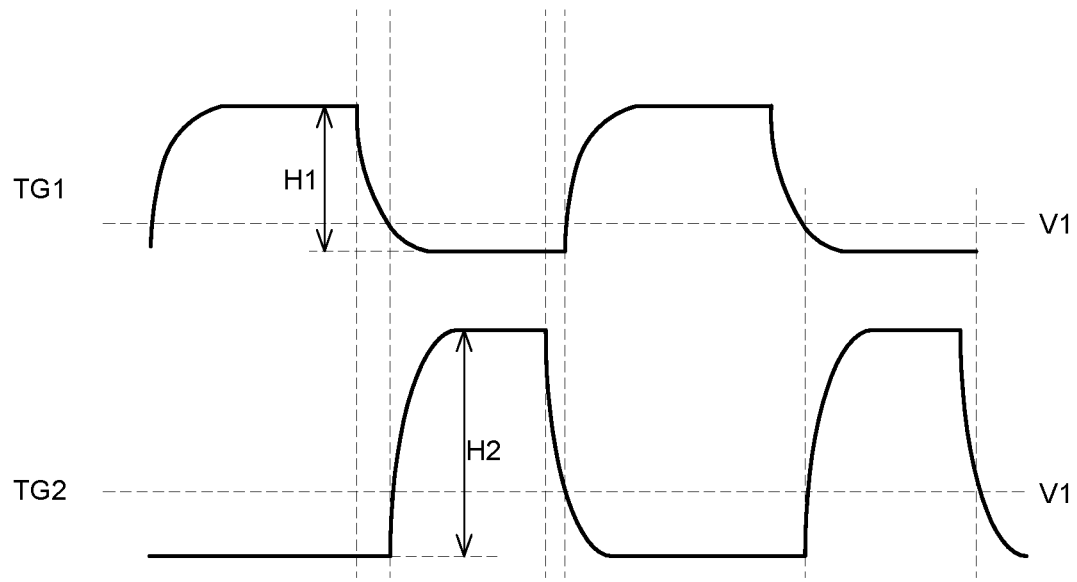

FIG. 12B illustrates a schematic operation timing for explaining a driving method of a display device still according to another exemplary embodiment of the present disclosure. In FIG. 12B, for the convenience of description, signals of the first touch gate line TG1 and the second touch gate line TG2 are schematically illustrated. FIG. 12B is the same as FIG. 12A except for a height H2 of the peak of the second touch gate signal, so that a redundant description will be omitted.

Referring to FIG. 12B, a height H2 of the peak of the second touch gate signal may be higher than a height H1 of the peak of the first touch gate signal. Accordingly, even though a period in which the second touch gate signal is a high level is relatively short, the height H2 of the peak is increased to increase a quantity of electric charges sensed by the plurality of sensing transistors TS1 and TS2. Here, the height of the peak refers to a difference between the low level and the high level.

Specifically, a timing when the first touch gate signal and the second touch gate signal are increased from the low level to the high level is changed so that the timings when the plurality of charging transistors TC1 and TC2 and the plurality of sensing transistors TS1 and TS2 are turned on do not overlap. At this time, a high level period of the second touch gate signal may be shorter than a high level period of the first touch gate signal. Therefore, the height H2 of the peak of the second touch gate signal is increased to be higher than the height H1 of the peak of the first touch gate signal so that the shortened high level period of the second touch gate signal may be compensated.

In the display device according to still another exemplary embodiment of the present disclosure, a difference between the low level and the high level of the second touch gate signal may be larger than a difference between the low level and the high level of the first touch gate signal. Accordingly, a quantity of electric charges sensed by the plurality of sensing transistors TS1 and TS2 is increased to improve the accuracy of touch sensing.

The exemplary embodiments of the present disclosure can also be described as follows:

According to an aspect of the present disclosure, a display device includes a substrate including a plurality of sub pixels; a first touch electrode on the substrate and overlapping each of the plurality of sub pixels; a second touch electrode which is disposed on the substrate to be spaced apart from the first touch electrode and overlap each of the plurality of sub pixels; an insulating layer covering the first touch electrode and the second touch electrode; a plurality of charging transistors on the insulating layer and electrically connected to one of the first touch electrode and the second touch electrode; a plurality of sensing transistors on the insulating layer and electrically connected to one of the first touch electrode and the second touch electrode; a planarization layer covering the plurality of charging transistors and the plurality of sensing transistors; and a light emitting diode on the planarization layer.

The plurality of sub pixels may include an emission area and a circuit area, the first touch electrode and the second touch electrode may be disposed to overlap an anode of the light emitting diode in the emission area, and the first touch electrode and the second touch electrode may be formed of a transparent conductive material.

The display device may further include a plurality of reference lines electrically connected to the plurality of sub pixels. One of a source electrode and a drain electrode of the plurality of charging transistors may be electrically connected to the plurality of reference lines. The other one of the source electrode and the drain electrode of the plurality of charging transistors may be electrically connected to the first touch electrode or the second touch electrode. One of a source electrode and a drain electrode of the plurality of sensing transistors may be electrically connected to the plurality of reference lines. And the other one of the source electrode and the drain electrode of the plurality of sensing transistors may be electrically connected to the first touch electrode or the second touch electrode.

The plurality of reference lines may be configured to apply a reference voltage to the plurality of sub pixels during a display period and may be configured to exchange signals for touching with the first touch electrode and the second touch electrode during a touch period.

The plurality of reference lines may include: a first reference line applying a first touching voltage to the first touch electrode during the touch period; a second reference line applying a second touching voltage to the second touch electrode during the touch period; and a plurality of third reference lines transmitting a touch sensing signal from the first touch electrode and the second touch electrode during the touch period.

The plurality of charging transistors may include: a first charging transistor to apply the first touching voltage to the first touch electrode through the first reference line; and a second charging transistor to apply the second touching voltage to the second touch electrode through the second reference line; and the plurality of sensing transistors may include: a first sensing transistor transmitting the touch sensing signal from the first touch electrode through one of the plurality of third reference lines; and a second sensing transistor which transmitting the touch sensing signal from the second touch electrode through the other one of the plurality of third reference lines.

The first touching voltage may be a sum of the reference voltage and a predetermined voltage and the second touching voltage may be a difference of the reference voltage and the predetermined voltage.

The display device may further include: a plurality of gate lines electrically connected to the plurality of sub pixels; a plurality of first touch gate lines extending in the same direction as the plurality of gate lines and electrically connected to the gate electrodes of the plurality of charging transistors; and a plurality of second touch gate lines extending in the same direction as the plurality of gate lines and electrically connected to the gate electrodes of the plurality of sensing transistors.

One frame may include: a display period in which a gate signal is applied to the plurality of gate lines; and a touch period in which a first touch gate signal and a second touch gate signal are applied to each of the plurality of first touch gate lines and the plurality of second touch gate lines, after the display period.

The first touch gate signal and the second touch gate signal may be inverted signals in the touch period.

When the level of the first touch gate signal is reduced to be a first voltage or lower, a level of the second touch gate signal may rise from a low level to a high level, when the level of the second touch gate signal is reduced to be the first voltage or lower, a level of the first touch gate signal may rise from a low level to a high level, and the first voltage may be a voltage higher than the voltage of the low level of the first touch gate signal and the second touch gate signal.

A difference of the low level and the high level of the second touch gate signal may be larger than a difference of the low level and the high level of the first touch gate signal.

The substrate may include a plurality of sub pixel blocks including some of the plurality of sub pixels, one frame may include a plurality of sub frames which sequentially drives the plurality of sub pixel blocks, each of the plurality of sub frames may include: a display period in which a gate signal is applied to the plurality of gate lines of one sub pixel block among the plurality of sub pixel blocks; and a touch period in which a first touch gate signal and a second touch gate signal are applied to each of the plurality of first touch gate lines and the plurality of second touch gate lines of the one sub pixel block among the plurality of sub pixel blocks, after the display period.

The plurality of sub pixel blocks may include a first sub pixel block and a second sub pixel block below the first sub pixel block and when the touch period in the sub frame for the first sub pixel block ends, the display period in the sub frame for the second sub pixel block may start.

The substrate may include a plurality of sub pixel blocks including some of the plurality of sub pixels, one frame may include a plurality of sub frames which sequentially drives the plurality of sub pixel blocks, each of the plurality of sub frames may include: a display period in which a gate signal is applied to the plurality of gate lines of one sub pixel block among the plurality of sub pixel blocks; a first touch period in which a first touch gate signal and a second touch gate signal are applied to each of the plurality of first touch gate lines and the plurality of second touch gate lines of the one sub pixel block among the plurality of sub pixel blocks, after the display period, and a second touch period in which a first touch gate signal and a second touch gate signal are applied to each of the plurality of first touch gate lines and the plurality of second touch gate lines of the other one sub pixel block among the plurality of sub pixel blocks, after the first touch period.

The display device may further include: a touch driver electrically connected to the plurality of charging transistors and the plurality of sensing transistors; a gate driver electrically connected to the plurality of sub pixels; and a printed circuit board electrically connected to the substrate at the outside of the substrate.

The touch driver may be disposed in the gate driver.

The gate driver may be mounted in a non-active area of the substrate in a gate in panel (GIP) manner.

The gate driver may be attached to a non-active area of the substrate.

The touch driver may be disposed on the printed circuit board.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
a substrate including a plurality of sub pixels;
a first touch electrode on the substrate, at least one sub pixel from the plurality of sub pixels overlapping the first touch electrode;
a second touch electrode on the substrate and spaced apart from the first touch electrode, the at least one sub pixel from the plurality of sub pixels overlapping the second touch electrode;
an insulating layer covering the first touch electrode and the second touch electrode:
a plurality of charging transistors on the insulating layer, the plurality of charging transistors electrically connected to one of the first touch electrode and the second touch electrode;
a plurality of sensing transistors on the insulating layer, the plurality of sensing transistors electrically connected to one of the first touch electrode and the second touch electrode;
a planarization layer covering the plurality of charging transistors and the plurality of sensing transistors; and
a light emitting diode on the planarization layer.

2. The display device according to claim 1, wherein the plurality of sub pixels includes an emission area and a circuit area,
wherein the first touch electrode and the second touch electrode include a transparent conductive material and an anode of the light emitting diode in the emission area overlaps the first touch electrode and the second touch electrode.

3. The display device according to claim 1, further comprising:
a plurality of reference lines electrically connected to the plurality of sub pixels,
wherein one of source electrodes or drain electrodes of the plurality of charging transistors are electrically connected to the plurality of reference lines,
wherein another one of the source electrodes or the drain electrodes of the plurality of charging transistors are electrically connected to the first touch electrode or the second touch electrode,
wherein one of source electrodes or drain electrodes of the plurality of sensing transistors are electrically connected to the plurality of reference lines, and
wherein another one of the source electrodes or the drain electrodes of the plurality of sensing transistors are electrically connected to the first touch electrode or the second touch electrode.

4. The display device according to claim 3, wherein the plurality of reference lines is configured to apply a reference voltage to the plurality of sub pixels during a display period during which an image is displayed, and the plurality of reference lines is configured to exchange signals for sensing touch with the first touch electrode and the second touch electrode during a touch period for sensing touch of the display device.

5. The display device according to claim 4, wherein the plurality of reference lines include:
a first reference line applying a first touch voltage to the first touch electrode during the touch period;
a second reference line applying a second touch voltage to the second touch electrode during the touch period; and
a plurality of third reference lines transmitting a touch sensing signal from the first touch electrode and the second touch electrode during the touch period.

6. The display device according to claim 5, wherein the plurality of charging transistors includes:
a first charging transistor configured to apply the first touch voltage to the first touch electrode through the first reference line during the touch period; and
a second charging transistor configured to apply the second touch voltage to the second touch electrode through the second reference line during the touch period, and
wherein the plurality of sensing transistors includes:
a first sensing transistor configured to transmit the touch sensing signal from the first touch electrode through one of the plurality of third reference lines during the touch period; and
a second sensing transistor configured to transmit the touch sensing signal from the second touch electrode through the other one of the plurality of third reference lines during the touch period.

7. The display device according to claim 6, wherein the first touch voltage is a sum of the reference voltage and a predetermined voltage, and the second touch voltage is a difference of the reference voltage and the predetermined voltage.

8. The display device according to claim 1, further comprising:
a plurality of gate lines electrically connected to the plurality of sub pixels:
a plurality of first touch gate lines extending in a same direction as the plurality of gate lines, the plurality of first touch gate lines electrically connected to gate electrodes of the plurality of charging transistors; and
a plurality of second touch gate lines extending in the same direction as the plurality of first touch gate lines, the plurality of second touch gate lines electrically connected to gate electrodes of the plurality of sensing transistors.

9. The display device according to claim 8, wherein one frame of the display device includes:
a display period during which a gate signal is applied to the plurality of gate lines; and
a touch period during which a first touch gate signal is applied to the plurality of first gate lines, and a second touch gate signal is applied to the plurality of second touch gate lines, the touch period after the display period.

10. The display device according to claim 9, wherein the first touch gate signal and the second touch gate signal are inverted with respect to each other during the touch period.

11. The display device according to claim 9, wherein responsive to a level of the first touch gate signal being reduced to less than or equal to a first voltage, a level of the second touch gate signal rises from a first level of the second touch gate signal to a second level of the second touch gate signal that is greater than the first level of the second touch gate signal,
wherein responsive to the level of the second touch gate signal being reduced to be less than or equal to the first voltage, the level of the first touch gate signal rises from a first level of the first touch gate signal to a second level of the first touch gate signal that is greater than the first level of the first touch gate signal, and
wherein the first voltage is greater than the first level of the first touch gate signal and the first level of the second touch gate signal.

12. The display device according to claim 11, wherein a difference of the first level and the second level of the second touch gate signal is greater than a difference of the first level and the second level of the first touch gate signal.

13. The display device according to claim 8, wherein the plurality of sub pixels are divided into a plurality of sub pixel blocks,
wherein one frame of the display device includes a plurality of sub frames during which the plurality of sub pixel blocks are sequentially driven,
wherein each of the plurality of sub frames includes:
a display period during which a gate signal is applied to a subset of gate lines from the plurality of gate lines that is connected to one sub pixel block among the plurality of sub pixel blocks; and
a touch period during which a first touch gate signal is applied to a subset of the plurality of first touch gate lines that is connected the one sub pixel block and a second touch gate signal is applied to a subset of the plurality of second touch gate lines that is connected to the one sub pixel block, the touch period after the display period.

14. The display device according to claim 13, wherein the one sub pixel block is a first sub pixel block and the plurality of sub pixel blocks further includes a second sub pixel block that is below the first sub pixel block, and
wherein responsive to the touch period in the sub frame for the first sub pixel block ending, a display period in a next sub frame for the second sub pixel block begins.

15. The display device according to claim 8, wherein the plurality of sub pixels are divided into a plurality of sub pixel blocks including a first sub pixel block and a second sub pixel block,
wherein one frame of the display device includes a plurality of sub frames during which the plurality of sub pixel blocks are sequentially driven,
wherein a sub frame of the plurality of sub frames includes:
a display period during which a gate signal is applied to a subset of gate lines from the plurality of gate lines that is connected to the first sub pixel block among the plurality of sub pixel blocks;
a first touch period during which a first touch gate signal is applied to a first subset of the plurality of first touch gate lines that is connected the first sub pixel block and a second touch gate signal is applied to a first subset of the plurality of second touch gate lines that is connected to the first sub pixel block, the first touch period after the display period, and
a second touch period during which a first touch gate signal is applied to a second subset of the plurality of first touch gate lines that is connected the second sub pixel block and a second touch gate signal is applied to a second subset of the plurality of second touch gate lines that is connected to the second sub pixel block among the plurality of sub pixel blocks, the second touch period after the first touch period.

16. A display device comprising:
a substrate;
a plurality of pixels on the substrate, the plurality of pixels including a first pixel comprising a light emitting element;
a touch block on the substrate, the touch block including a first electrode including a plurality of first sub electrodes and a second electrode including a plurality of second sub electrodes that are interleaved between the plurality of first sub electrodes such that at least one first sub electrode is disposed between two second sub electrodes; and
a plurality of reference lines configured to apply a reference voltage to the plurality of pixels during a display period during which an image is displayed, and the plurality of reference lines configured to exchange signals for sensing touch with the first electrode and the second electrode during a touch period for sensing touch of the display device,
wherein the light emitting element overlaps the first electrode and the second electrode and the first electrode and the second electrode are closer to the substrate than the light emitting element.

17. The display device of claim 16, wherein the first electrode further comprises a first connection electrode that extends in a first direction and the plurality of first sub electrodes extend from the first connection electrode in a second direction that intersects the first direction,
wherein the second electrode further comprises a second connection electrode that extends in the first direction and the plurality of second sub electrodes extend from the second connection electrode in the second direction.

18. The display device of claim 17, further comprising:
a first charging transistor that is connected to the first electrode, the first charging transistor configured to apply a first touch voltage to the first electrode through a first reference line of the plurality of reference lines during the touch period;
a second charging transistor that is connected to the second electrode, the second charging transistor configured to apply a second touch voltage to the second electrode through a second reference line of the plurality of reference lines during the touch period,
a first sensing transistor that is connected to the first electrode, the first sensing transistor configured to transmit a first touch sensing signal from the first electrode through a third reference line of the plurality of reference lines during the touch period; and
a second sensing transistor that is connected to the second electrode, the second sensing transistor configured to transmit a second touch sensing signal from the second electrode through a fourth reference line of the plurality of reference lines during the touch period.

19. The display device of claim 18, wherein the first touching voltage is a sum of the reference voltage and a predetermined voltage, and the second touching voltage is a difference of the reference voltage and the predetermined voltage.

20. The display device of claim 16, wherein an anode of the light emitting element overlap the first electrode and the second electrode.

* * * * *